US012666719B2

(12) United States Patent
Shin et al.

(10) Patent No.: US 12,666,719 B2
(45) Date of Patent: Jun. 23, 2026

(54) DISPLAY DEVICE

(71) Applicant: Samsung Display Co., LTD., Yongin-si (KR)

(72) Inventors: Dong Hee Shin, Yongin-si (KR); No Kyung Park, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 509 days.

(21) Appl. No.: 18/123,426

(22) Filed: Mar. 20, 2023

(65) Prior Publication Data

US 2023/0378191 A1      Nov. 23, 2023

(30) Foreign Application Priority Data

May 17, 2022      (KR) ......................... 10-2022-0060490

(51) Int. Cl.
H10D 86/60          (2025.01)
G09G 3/3233          (2016.01)
(Continued)

(52) U.S. Cl.
CPC ........... H10D 86/60 (2025.01); G09G 3/3233 (2013.01); H10D 86/441 (2025.01); H10H 29/30 (2025.01);
(Continued)

(58) Field of Classification Search
CPC . H01L 27/156; H01L 25/0753; H01L 33/387; H01L 27/153; H10H 29/37; H10H 29/30;

H10H 29/142; H10H 29/32; H10H 29/34; H10H 29/352; H10H 29/39; H10H 29/41; H10H 29/45; H10H 29/922; H10H 29/942; H10H 20/857; H10H 20/8316;
(Continued)

(56) References Cited

U.S. PATENT DOCUMENTS 11,984,368 B2      5/2024    Ko et al.
12,356,767 B2      7/2025    Jeong et al.
(Continued)

FOREIGN PATENT DOCUMENTS

KR      10-2018-0036818          4/2018
KR      10-2021-0103602 A      8/2021
(Continued)

*Primary Examiner* — Julio J Maldonado
*Assistant Examiner* — Kenneth S. Stephenson
(74) *Attorney, Agent, or Firm* — Womble Bond Dickinson (US) LLP

(57)          ABSTRACT

A display device includes a thin film transistor layer disposed on a substrate and including a transistor, a first electrode and a second electrode, each disposed on the thin film transistor layer and extending in parallel with each other, a bank pattern disposed on the first and second electrodes, an insulating layer disposed on the bank pattern and the first and second electrodes and including an open part provided on an upper surface of the bank pattern, a plurality of light emitting elements disposed between the first and second electrodes on the insulating layer, and a surface treatment part on the upper surface of the bank pattern exposed by the open part and having hydrophobicity. A shape of the open part has lines bent plural times or lines curved plural times in a plan view.

20 Claims, 14 Drawing Sheets

(51) Int. Cl.

| | | |
|---|---|---|
| *H10D 86/40* | (2025.01) | |
| *H10H 29/30* | (2025.01) | |
| *H10H 29/37* | (2025.01) | |
| *H10K 59/122* | (2023.01) | |
| *H10K 59/123* | (2023.01) | |

(52) U.S. Cl.
CPC ..... *H10H 29/37* (2025.01); *G09G 2300/0426* (2013.01); *G09G 2300/0819* (2013.01); *G09G 2300/0842* (2013.01); *H10K 59/122* (2023.02); *H10K 59/123* (2023.02)

(58) Field of Classification Search
CPC ...... H10H 20/882; H10H 29/49; H10H 29/14; H10H 29/882; H10H 29/03; H10H 29/011; H10H 20/01; H10H 29/10; H10H 29/012
See application file for complete search history.

(56)                    References Cited

U.S. PATENT DOCUMENTS

| | | | |
|---|---|---|---|
| 2022/0392947 A1* | 12/2022 | Oh ...................... | H01L 25/0753 |
| 2023/0207571 A1 | 6/2023 | Hong et al. | |

FOREIGN PATENT DOCUMENTS

| | | | | |
|---|---|---|---|---|
| KR | 10-2021-0145030 A | 12/2021 | | |
| KR | 10-2022-0019196 A | 2/2022 | | |
| WO | WO-2021045413 A1* | 3/2021 | ........... | G09G 3/3233 |

\* cited by examiner

FIG. 1

GL: VGL, HGL, BGL
SP: SP1, SP2, SP3

GL: VGL, HGL, BGL

MTL1: VDL, CPE2, VIL
ACTL: DE1, ACT1, SE1, DE3, ACT3, SE3
MTL2: CE15, GE1, CE4, GE3, CE3

FIG. 7

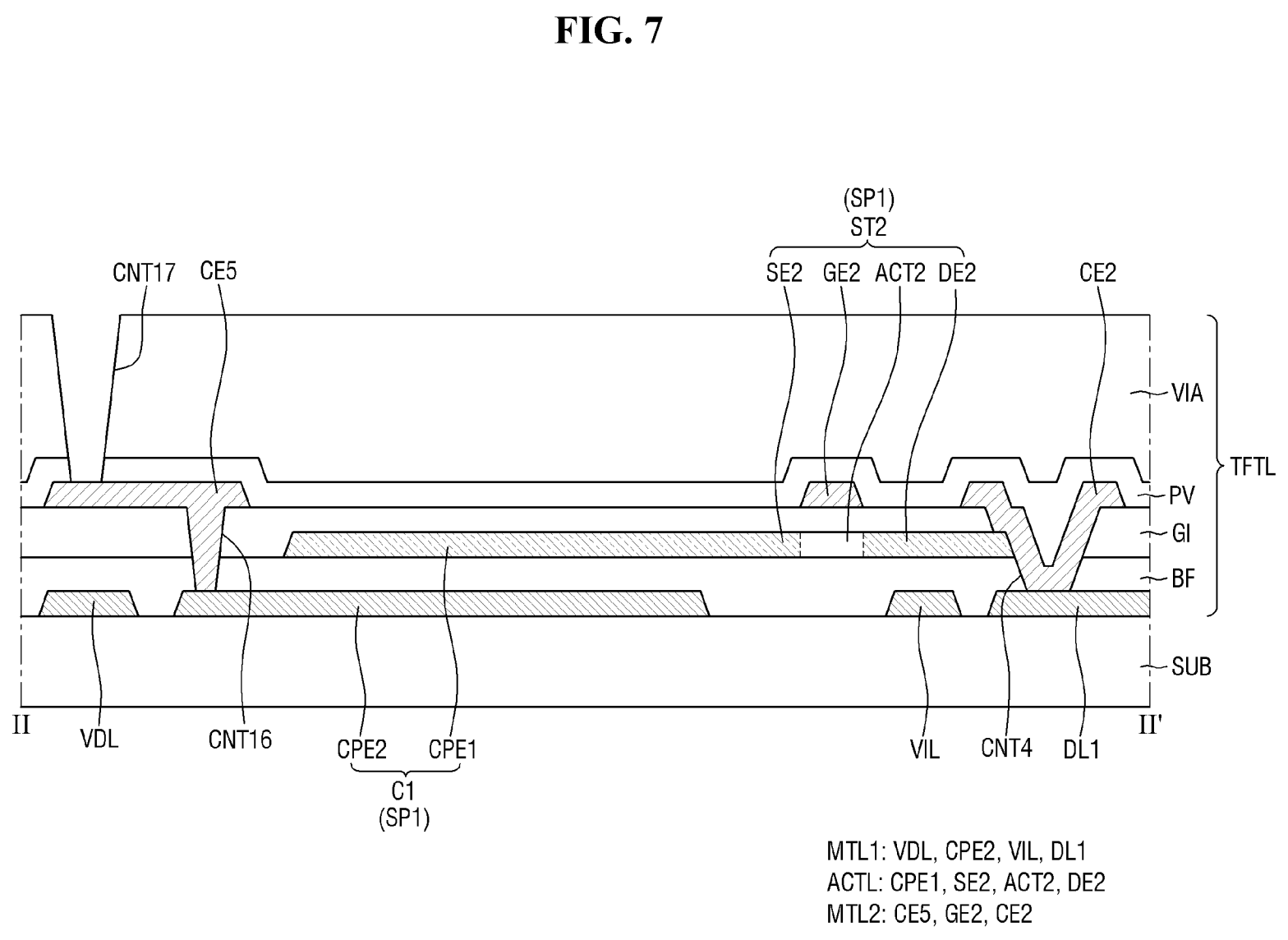

TFTL

VIA

PV

GI

BF

SUB

II'

CE2

DL1

CNT4

VIL

DE2
ACT2
GE2
SE2

ST2
(SP1)

CPE1

C1
(SP1)

CPE2

CNT16

CNT17    CE5

CNT16

VDL

II

MTL1: VDL, CPE2, VIL, DL1
ACTL: CPE1, SE2, ACT2, DE2
MTL2: CE5, GE2, CE2

MTL1: VDL, CPE2, VIL, DL1
ACTL: DE1, ACT1, SE1, SE2, ACT2, DE2
MTL2: GE1, CPE1, GE2
MTL3: CE1, CE2, CE4

MTL4: RME1, RME2
MTL5: CTE1, CTE2, CTE4, CTE5

DISPLAY DEVICE

CROSS-REFERENCE TO RELATED APPLICATION(S)

This application claims priority to and benefits of Korean Patent Application No. 10-2022-0060490 under 35 U.S.C. § 119, filed on May 17, 2022, in the Korean Intellectual Property Office (KIPO), the entire contents of which are herein incorporated by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes light emitting elements that may emit light by themselves. The light emitting element may be an organic light emitting diode that uses an organic material as a fluorescent material and an inorganic light emitting diode that uses an inorganic material as a fluorescent material.

SUMMARY

Aspects of the disclosure provide a display device capable of preventing disconnection of a contact electrode disposed on an insulating layer.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a thin film transistor layer disposed on a substrate and including a thin film transistor, a first electrode and a second electrode, each disposed on the thin film transistor layer and extending in parallel with each other, a bank pattern disposed on the first and second electrodes, an insulating layer disposed on the bank pattern and the first and second electrodes and including an open part provided on an upper surface of the bank pattern, a plurality of light emitting elements disposed between the first and second electrodes on the insulating layer, and a surface treatment part on the upper surface of the bank pattern exposed by the open part and having hydrophobicity. A shape of the open part may have lines bent plural times or lines curved plural times in a plan view.

The shape of the open part may be a zigzag shape or a wave shape in a plan view.

The shape of the open part may have a plurality of convex portions or a plurality of concave portions in a plan view.

The display device may further include a first contact electrode disposed on the insulating layer and the surface treatment part, and a second contact electrode spaced apart from the first contact electrode and disposed on the insulating layer and the surface treatment part.

The first contact electrode may be disposed on the first electrode, and the first contact electrode may be electrically connected to the first electrode through a first contact hole provided in the insulating layer.

The first contact electrode may supply a driving current received from the first electrode to an end of each of the plurality of light emitting elements.

The second contact electrode may be disposed on the second electrode, and the second contact electrode may be electrically connected to the second electrode through a second contact hole provided in the insulating layer.

The second contact electrode may be electrically connected to an end of each of the plurality of light emitting elements, and the second contact electrode may receive a low potential voltage from the second electrode.

The bank pattern may include at least one separation space. The plurality of light emitting elements may be disposed in the at least one separation space.

The insulating layer and the bank pattern may include a hydrophilic insulating material, and the surface treatment part may be formed by a plasma treatment process to have the hydrophobicity.

According to an embodiment of the disclosure, a display device may include a thin film transistor layer disposed on a substrate and including a transistor, a first electrode and a second electrode, each disposed on the thin film transistor layer and extending in parallel with each other, a bank pattern disposed on the first and second electrodes, an insulating layer disposed on the bank pattern and including an open part provided on an upper surface of the bank pattern, a plurality of light emitting elements disposed between the first and second electrodes on the insulating layer, and a surface treatment part on the upper surface of the bank pattern exposed by the open part and having hydrophobicity. A shape of the surface treatment part may be a zigzag shape or a wave shape in a plan view.

The shape of the surface treatment part may have lines bent plural times or lines curved plural times in a plan view.

The shape of the surface treatment part may have a plurality of convex portions or a plurality of concave portions in a plan view.

The display device may further include a first contact electrode, a second contact electrode, a third contact electrode, a fourth contact electrode, and a fifth contact electrode, each disposed on the insulating layer or the surface treatment part.

The plurality of light emitting elements may include first light emitting elements electrically connected between the first and second contact electrodes, second light emitting elements electrically connected between the second and third contact electrodes, third light emitting elements electrically connected between the third and fourth contact electrodes, and fourth light emitting elements electrically connected between the fourth and fifth contact electrodes.

The first and second light emitting elements may be arranged to be collinear with each other, and the third and fourth light emitting elements may be arranged to be collinear with each other.

The bank pattern may surround the first to fourth light emitting elements and includes at least one separation space, and the first to fourth light emitting elements may be disposed in the at least one separation space of the bank pattern.

The first contact electrode may be electrically connected to the first electrode to receive a driving current from the first electrode. The fifth contact electrode may be electrically connected to the second electrode to receive a low potential voltage from the second electrode.

The insulating layer and the bank pattern may include a hydrophilic insulating material, and the surface treatment part may be formed by a plasma treatment process to have the hydrophobicity.

The thin film transistor layer may include a first transistor supplying a driving current to the plurality of light emitting elements, a second transistor supplying a data voltage to a first node that is electrically connected to a gate electrode of the first transistor, a third transistor supplying an initialization voltage to a second node that is electrically connected to a source electrode of the first transistor, and a first capacitor electrically connected between the first node and the second node.

In accordance with the display device according to embodiments, a shape of an open part in a plan view may have lines bent plural times or lines curved plural times. Accordingly, even though an undercut of a surface treatment part occurs in a process of forming the open part of an insulating layer, contact areas between the surface treatment part and contact electrodes may be increased, and thus, disconnection of the contact electrodes may be prevented.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 1 is a plan view illustrating a display device according to an embodiment;

FIG. 7 is a schematic cross-sectional view taken along line II-II' of FIGS. 4 and 5;

DETAILED DESCRIPTION OF THE EMBODIMENTS

Figure 2:
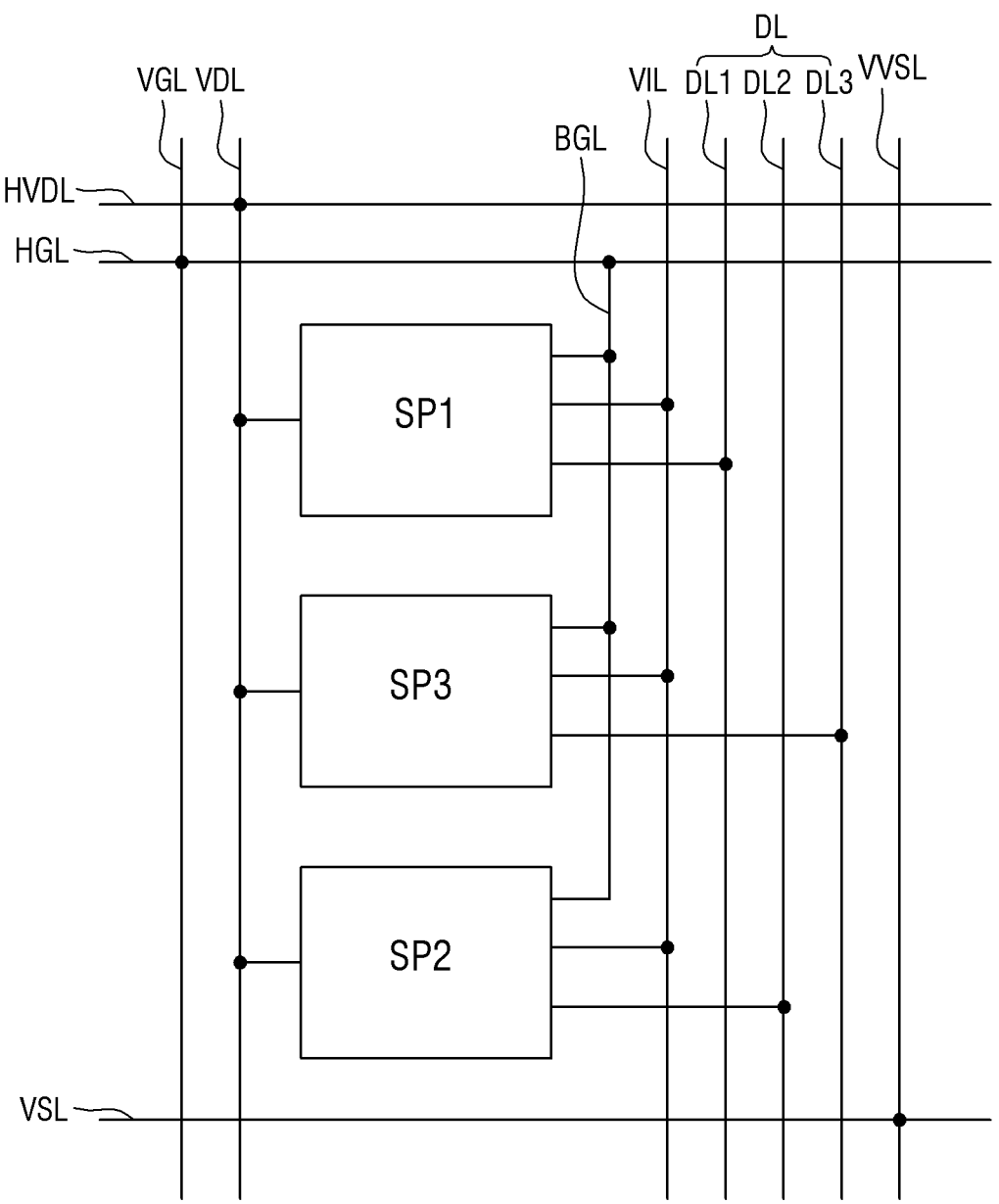
FIG. 2 is a view illustrating pixels and lines of the display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure are described with reference to the accompanying drawings.

Figure 1:
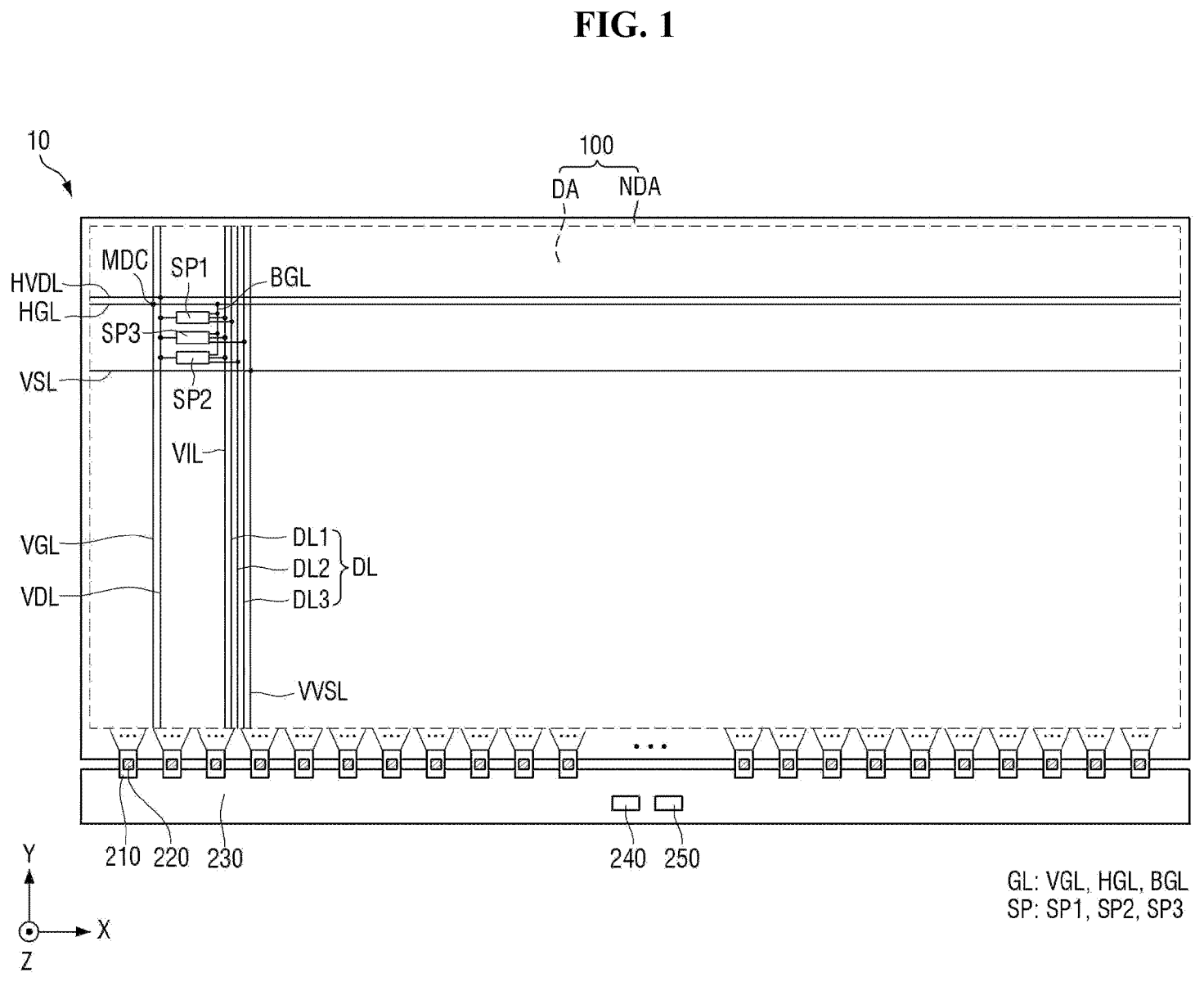

FIG. 1 is a plan view illustrating a display device according to an embodiment.

The terms "above", "top", and "upper surface" as used herein refer to an upward direction (i.e., a Z-axis direction) with respect to a display device 10. The terms "below", "bottom", and "lower surface" as used herein refer to a downward direction (i.e., a direction opposite to the Z-axis direction) with respect to the display device 10. In addition, "left", "right", "upper", and "lower" refer to directions when the display device 10 is viewed from above. For example, "left" refers to a direction opposite to an X-axis direction, "right" refers to the X-axis direction, "upper" refers to a Y-axis direction, and "lower" refers to a direction opposite to the Y-axis direction.

Referring to FIG. 1, a display device 10 may be a device that displays a moving image or a still image, and may be used as a display screen of various products such as televisions, laptop computers, monitors, billboards, and Internet of Things (JOT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device 10 may include a display panel 100, flexible films 210, display drivers 220, a circuit board 230, a timing controller 240, and a power supply 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner where the long side in the first direction (X-axis direction) and the short side in the second direction (Y-axis direction) meet may be right-angled or may be rounded with a curvature. The shape of the display panel 100 in a plan view is not limited to the rectangular shape, and may be other polygonal shapes, a circular shape, or an elliptical shape. For example, the display panel 100 may be formed to be flat, but is not limited thereto. For example, the display panel 100 may be formed to be bent with a curvature.

The display panel 100 may include a display area DA and a non-display area NDA.

The display area DA is an area displaying an image, and may be defined as a central area of the display panel 100. The display area DA may include pixels SP, gate lines GL, data lines DL, initialization voltage lines VIL, first voltage lines VDL, horizontal voltage lines HVDL, vertical voltage lines VVSL, and second voltage lines VSL. The pixels SP may be formed in areas intersected by multiple data lines DL and multiple gate lines GL. The pixel SP may include first to third pixels SP1, SP2, and SP3. Each of the first to third pixels SP1, SP2, and SP3 may be connected to one gate line GL and one data line DL. Each of the first to third pixels SP1, SP2, and SP3 may be defined as an area of a minimum unit emitting light.

The first pixel SP1 may emit light of a first color or red light, the second pixel SP2 may emit light of a second color or green light, and the third pixel SP3 may emit light of a third color or blue light. A pixel circuit of the first pixel SP1, a pixel circuit of the third pixel SP3, and a pixel circuit of the second pixel SP2 may be arranged in a direction opposite to the second direction (Y-axis direction), but the arrangement of the pixel circuits is not limited thereto.

The gate line GL may include a vertical gate line VGL, a horizontal gate line HGL, and an auxiliary gate line BGL.

Multiple vertical gate lines VGL may be connected to the display drivers 220, may extend in the second direction (Y-axis direction), and may be spaced apart from each other in the first direction (X-axis direction). The vertical gate lines VGL may be disposed in parallel with the data lines DL. Multiple horizontal gate lines HGL may extend in the first direction (X-axis direction) and may be spaced apart from each other in the second direction (Y-axis direction). The horizontal gate lines HGL may intersect the vertical gate lines VGL, respectively. For example, one horizontal gate line HGL may be connected to one vertical gate line VGL of the vertical gate lines VGL through a contact part MDC. The contact part MDC may correspond to a portion where the horizontal gate line HGL is inserted into a contact hole to contact with the vertical gate line VGL. The auxiliary gate lines BGL may extend from the horizontal gate lines HGL and supply gate signals to the first to third pixels SP1, SP2, and SP3.

The data lines DL may extend in the second direction (Y-axis direction) and may be spaced apart from each other in the first direction (X-axis direction). The data lines DL may include first to third data lines DL1, DL2, and DL3.

Each of the first to third data lines DL1, DL2, and DL3 may supply a data voltage to each of the first to third pixels SP1, SP2, and SP3.

Multiple initialization voltage lines VIL may extend in the second direction (Y-axis direction) and may be spaced apart from each other in the first direction (X-axis direction). The initialization voltage lines VIL may supply initialization voltages received from the display drivers 220 to the pixel circuit of each of the first to third pixels SP1, SP2, and SP3. The initialization voltage lines VIL may receive sensed signals from the pixel circuit of each of the first to third pixels SP1, SP2, and SP3 and supply the sensed signals to the display drivers 220.

Multiple first voltage lines VDL may extend in the second direction (Y-axis direction) and may be spaced apart from each other in the first direction (X-axis direction). The first voltage lines VDL may supply a driving voltage or a high potential voltage received from the power supply 250 to the first to third pixels SP1, SP2, and SP3.

Multiple horizontal voltage lines HVDL may extend in the first direction (X-axis direction) and may be spaced apart from each other in the second direction (Y-axis direction). The horizontal voltage lines HVDL may be connected to the first voltage lines VDL. The horizontal voltage lines HVDL may receive the driving voltage or the high potential voltage from the first voltage lines VDL.

The vertical voltage lines VVSL may extend in the second direction (Y-axis direction) and may be spaced apart from each other in the first direction (X-axis direction). The vertical voltage lines VVSL may be connected to the second voltage lines VSL. The vertical voltage lines VVSL may supply a low potential voltage received from the power supply 250 to the second voltage lines VSL.

The second voltage lines VSL may extend in the first direction (X-axis direction) and may be spaced apart from each other in the second direction (Y-axis direction). The second voltage lines VSL may supply the low potential voltage to the first to third pixels SP1, SP2, and SP3.

Connection relationships between the pixels SP, the gate lines GL, the data lines DL, the initialization voltage lines VIL, the first voltage lines VDL, and the second voltage lines VSL may be changed in design according to the number and an arrangement of pixels SP.

The non-display area NDA may be defined as an area other than the display area DA in the display panel 100. For example, the non-display area NDA may include fan-out lines connecting the vertical gate lines VGL, the data lines DL, the initialization voltage lines VIL, the first voltage lines VDL, and the vertical voltage lines VVSL to the display drivers 220, respectively, and pad parts connected to the flexible films 210.

Input terminals provided on one sides of the flexible films 210 may be attached to the circuit board 230 by a film attaching process, and output terminals provided on another sides of the flexible films 210 may be attached to the pad parts by a film attaching process. For example, the flexible film 210 may be bent like a tape carrier package or a chip on film. The flexible films 210 may be bent below the display panel 100 in order to decrease a bezel area of the display device 10.

The display driver 220 may be mounted on the flexible film 210. For example, the display driver 220 may be implemented as an integrated circuit (IC). The display drivers 220 may receive digital video data and data control signals from the timing controller 240, convert the digital video data into analog data voltages according to the data control signals, and supply the analog data voltages to the data lines DL through the fan-out lines. The display drivers 220 may generate gate signals according to gate control signals supplied from the timing controller 240 and sequentially supply the gate signals to the vertical gate lines VGL according to a set order. Accordingly, the display drivers 220 may simultaneously serve as data drivers and gate drivers. The display device 10 may include the display drivers 220 disposed on the lower side of the non-display area NDA, and thus, sizes of the left, right, and upper sides of the non-display area NDA may be minimized.

The circuit board 230 may support the timing controller 240 and the power supply 250, and supply signals and power to the display drivers 220. For example, the circuit board 230 may supply signals supplied from the timing controller 240 and source voltages supplied from the power supply 250 to the display drivers 220 in order to display an image in each pixel. Signal lines and power lines may be provided on the circuit board 230 and may supply the signals and the source voltages.

The timing controller 240 may be mounted on the circuit board 230 and may receive image data and timing synchronization signals supplied from a display driving system or a graphic device through a user connector provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate the data control signals and the gate control signals based on the timing synchronization signals. The timing controller 240 may control a supply timing of data voltages of the display drivers 220 based on the data control signals, and control a supply timing of the gate signals of the display drivers 220 based on the gate control signals.

The power supply 250 may be disposed on the circuit board 230, and may supply source voltages to the display drivers 220 and the display panel 100. For example, the power supply 250 may generate a driving voltage or a high potential voltage and supply the driving voltage or the high potential voltage to the first voltage lines VDL, may generate a low potential voltage and supply the low potential voltage to the vertical voltage lines VVSL, and may generate an initialization voltage and supply the initialization voltage to the initialization voltage lines VIL.

FIG. 2 is a view illustrating pixels and lines of the display device according to an embodiment.

Referring to FIG. 2, the pixel SP may include first to third pixels SP1, SP2, and SP3. A pixel circuit of the first pixel SP1, a pixel circuit of the third pixel SP3, and a pixel circuit of the second pixel SP2 may be arranged in a direction opposite to the second direction (Y-axis direction), but the order of the pixel circuits is not limited thereto.

The pixel circuit of each of the first to third pixels SP1, SP2, and SP3 may be connected to the first voltage line VDL, the initialization voltage line VIL, the gate line GL, and the data line DL.

The first voltage lines VDL may extend in the second direction (Y-axis direction). The first voltage line VDL may be disposed on the left side of the pixel circuits of the first to third pixels SP1, SP2, and SP3. The first voltage line VDL may supply the driving voltage or the high potential voltage to a transistor of each of the first to third pixels SP1, SP2, and SP3.

The horizontal voltage line HVDL may extend in the first direction (X-axis direction). The horizontal voltage line HVDL may be disposed on the upper side of the horizontal gate line HGL. The horizontal voltage line HVDL may be connected to the first voltage line VDL. The horizontal voltage line HVDL may receive the driving voltage or the high potential voltage from the first voltage line VDL.

The initialization voltage line VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage line VIL may supply the initialization voltage to the pixel circuit of each of the first to third pixels SP1, SP2, and SP3. The initialization voltage line VIL may receive the sensed signal from the pixel circuit of each of the first to third pixels SP1, SP2, and SP3 and supply the sensed signals to the display driver 220.

The gate line GL may include the vertical gate line VGL, the horizontal gate line HGL, and the auxiliary gate line BGL.

The vertical gate lines VGL may extend in the second direction (Y-axis direction). The vertical gate line VGL may be connected between the display driver 220 and the horizontal gate line HGL. The vertical gate lines VGL may intersect the horizontal gate lines HGL, respectively. The vertical gate line VGL may supply the gate signal received from the display driver 220 to the horizontal gate line HGL.

The horizontal gate line HGL may extend in the first direction (X-axis direction). The horizontal gate line HGL may be disposed on the upper side of the pixel circuit of the first pixel SP1. The horizontal gate line HGL may be connected between the vertical gate line VGL and the auxiliary gate line BGL. The horizontal gate line HGL may supply the gate signal received from the vertical gate line VGL to the auxiliary gate line BGL.

The auxiliary gate line BGL may extend in the direction opposite to the second direction (Y-axis direction) from the horizontal gate line HGL. The auxiliary gate line BGL may be disposed on the right side of the pixel circuits of the first to third pixels SP1, SP2, and SP3. The auxiliary gate line BGL may supply the gate signal received from the horizontal gate line HGL to the pixel circuits of the first to third pixels SP1, SP2, and SP3.

The data lines DL may extend in the second direction (Y-axis direction). The data lines DL may supply the data voltages to the pixels SP. The data lines DL may include first to third data lines DL1, DL2, and DL3.

The first data line DL1 may extend in the second direction (Y-axis direction). The first data line DL1 may be disposed on the right side of the initialization voltage line VIL. The first data line DL1 may supply the data voltage received from the display driver 220 to the pixel circuit of the first pixel SP1.

The second data line DL2 may extend in the second direction (Y-axis direction). The second data line DL2 may be disposed on the right side of the first data line DL1. The second data line DL2 may supply the data voltage received from the display driver 220 to the pixel circuit of the second pixel SP2.

The third data line DL3 may extend in the second direction (Y-axis direction). The third data line DL3 may be disposed on the right side of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be disposed on the right side of the third data line DL3.

The vertical voltage line VVSL may be connected between the power supply 250 and the second voltage line VSL. The vertical voltage line VVSL may supply the low potential voltage supplied from the power supply 250 to the second voltage line VSL.

The second voltage line VSL may extend in the first direction (X-axis direction). The second voltage line VSL may be disposed on the lower side of the pixel circuit of the second pixel SP2. The second voltage line VSL may supply the low potential voltage received from the vertical voltage line VVSL to light emitting element layers of the first to third pixels SP1, SP2, and SP3.

Figure 3:
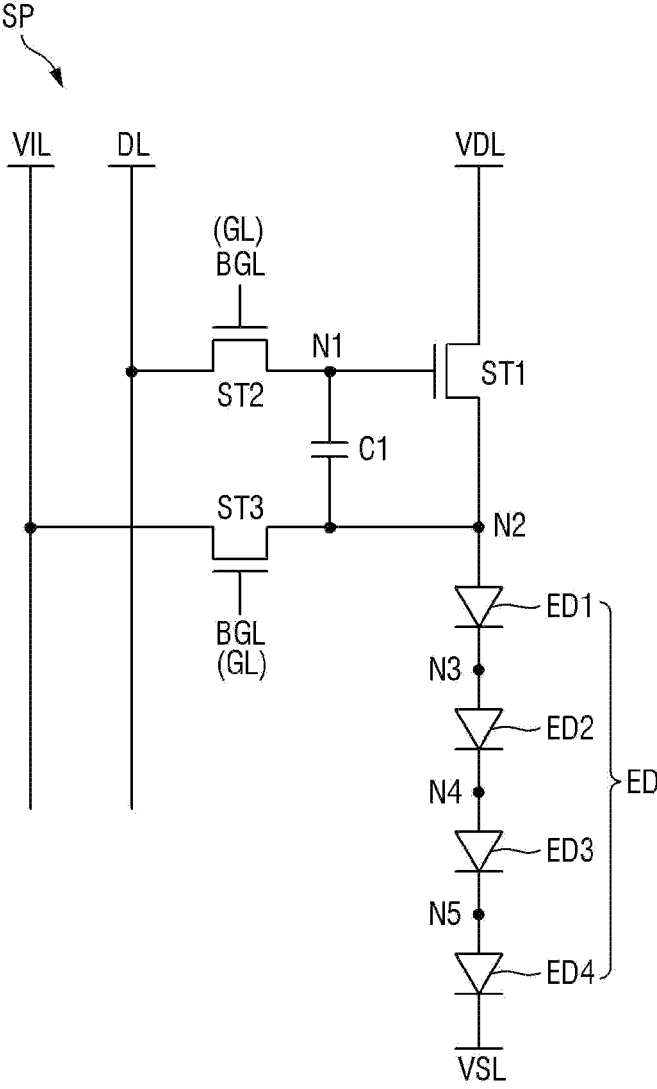
FIG. 3 is a schematic diagram of an equivalent circuit a pixel of the display device according to an embodiment.

FIG. 3 is a schematic diagram of an equivalent circuit of a pixel of the display device according to an embodiment.

Referring to FIG. 3, each of the pixels SP may be connected to a first voltage line VDL, a data line DL, an initialization voltage line VIL, a gate line GL, and a second voltage line VSL.

Each of first to third pixels SP1, SP2, and SP3 may include first to third transistors ST1, ST2, and ST3, a first capacitor C1, and multiple light emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a drain-source current (or a driving current) based on a data voltage applied to the gate electrode.

The light emitting elements ED may include first to fourth light emitting elements ED1, ED2, ED3, and ED4. The first to fourth light emitting elements ED1, ED2, ED3, and ED4 may be connected to each other in series. The first to fourth light emitting elements ED1, ED2, ED3, and ED4 may receive the driving current to emit light. A light emission amount or luminance of the light emitting element ED may be proportional to a magnitude of the driving current. The light emitting element ED may be an inorganic light emitting element including an inorganic semiconductor, but is not limited thereto.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a drain electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to a fourth node N4. A first electrode of the third light emitting element ED3 may be connected to the fourth node N4, and a second electrode of the third light emitting element ED3 may be connected to a fifth node N5. A first electrode of the fourth light emitting element ED4 may be connected to the fifth node N5, and a second electrode of the fourth light emitting element ED4 may be connected to the second voltage line VSL.

The second transistor ST2 may be turned on by a gate signal of the gate line GL to electrically connect the data line DL and the first node N1, which is connected to the gate electrode of the first transistor ST1, to each other. The second transistor ST2 may be turned on by the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal of the gate line GL to electrically connect the initialization voltage line VIL and the second node N2, which is connected to the source electrode of the first transistor ST1, to each other. The third transistor ST3 may be turned on by the gate signal to supply an initialization voltage to the second node N2. The third transistor ST3 may be turned on by the gate signal to supply a sensed signal to the initialization voltage line VIL. A gate electrode of the third transistor ST3 may be connected to the gate line GL, the drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, the second capacitor electrode of the first capacitor C1, and the first electrode of the first light emitting element ED1 through the second node N2.

Figure 4:
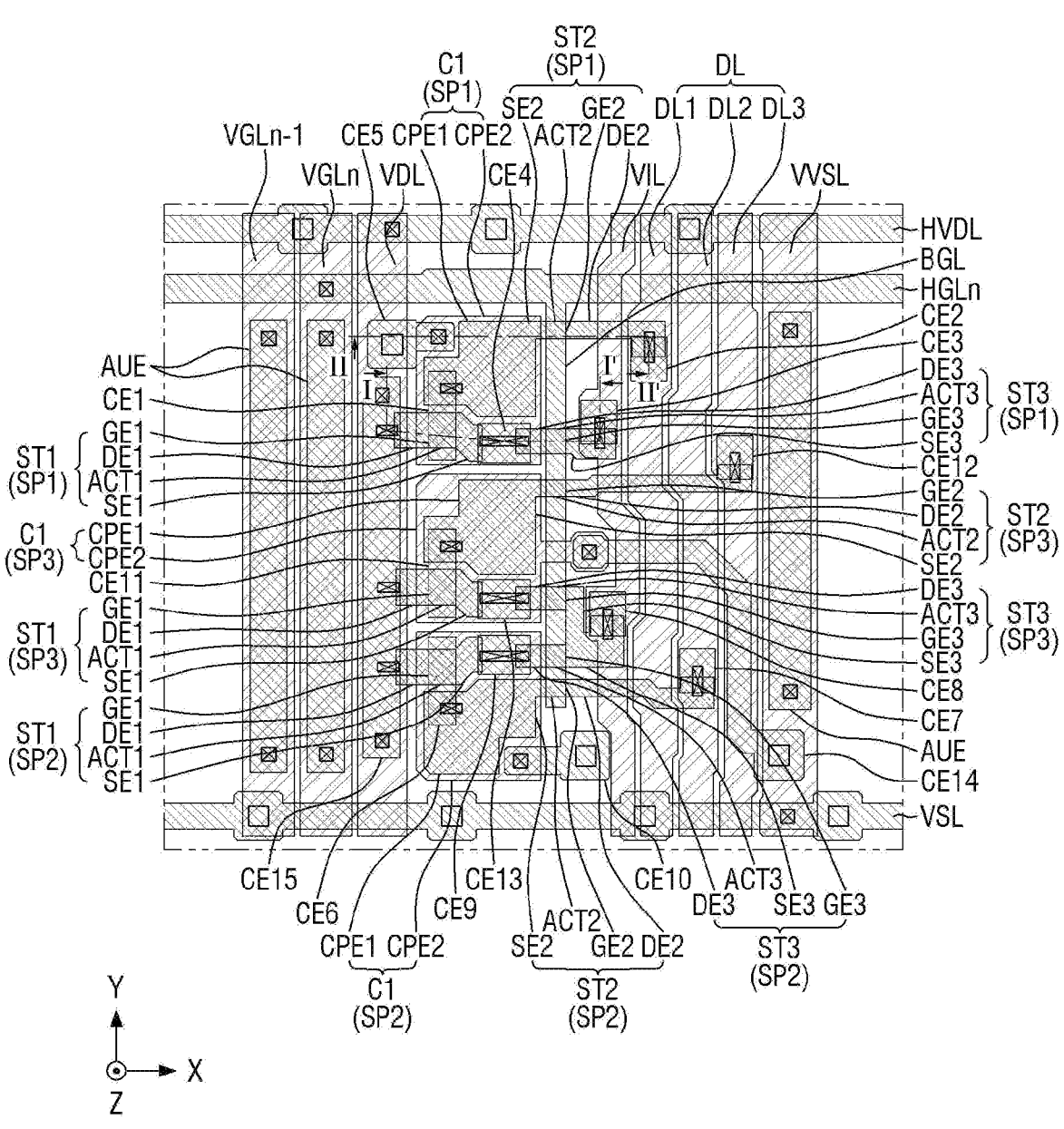
FIG. 4 is a plan view illustrating a thin film transistor layer of the display device according to an embodiment.
Figure 5:
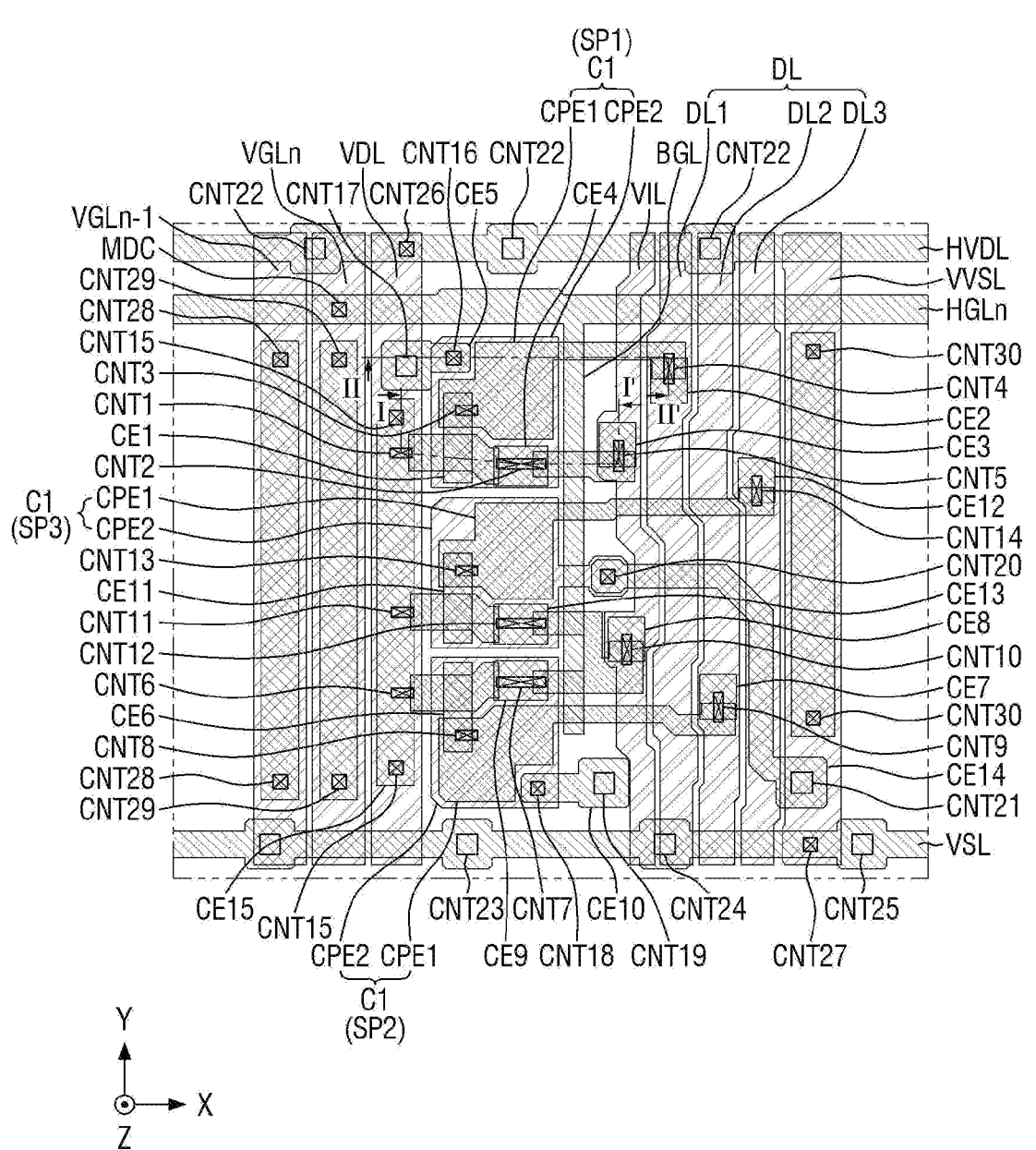
FIG. 5 is a plan view illustrating a thin film transistor layer of the display device according to an embodiment.
Figure 6:
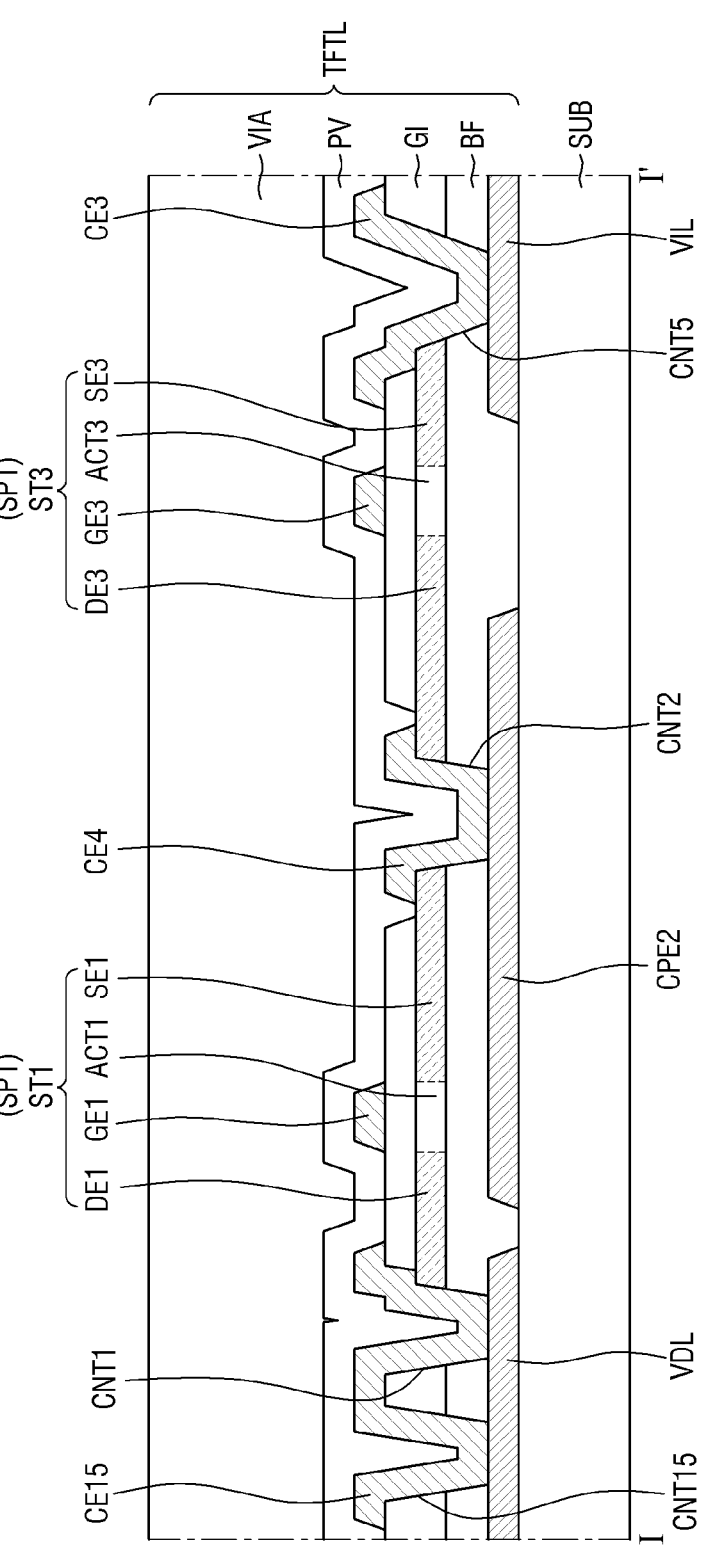
FIG. 6 is a schematic cross-sectional view taken along line I-I' of FIGS. 4 and 5.

FIGS. 4 and 5 are plan views illustrating a thin film transistor layer of the display device according to an embodiment. FIG. 6 is a schematic cross-sectional view taken along line I-I' of FIGS. 4 and 5, and FIG. 7 is a schematic cross-sectional view taken along line II-IF of FIGS. 4 and 5.

Referring to FIGS. 4 to 7, the display area DA may include a pixel SP, a first voltage line VDL, a horizontal voltage line HVDL, an initialization voltage line VIL, an n−1-th vertical gate line VGLn−1, an n-th vertical gate line VGLn, an n-th horizontal gate line HGLn, an auxiliary gate line BGL, a data line DL, a vertical voltage line VVSL, and a second voltage line VSL.

The pixel SP may include first to third pixels SP1, SP2, and SP3. A pixel circuit of the first pixel SP1, a pixel circuit of the third pixel SP3, and a pixel circuit of the second pixel SP2 may be arranged in the direction opposite to the second direction (Y-axis direction). The pixel circuit of each of the first to third pixels SP1, SP2, and SP3 may be disposed in a pixel.

The first voltage line VDL may be disposed at a first metal layer MTL1 on a substrate SUB. The first voltage line VDL may be disposed on the left side of the pixel circuits of the first to third pixels SP1, SP2, and SP3. The first voltage line VDL may overlap a fifteenth connection electrode CE15 of a second metal layer MTL2 in a thickness direction (Z-axis direction). The first voltage line VDL may be connected to the fifteenth connection electrode CE15 through a fifteenth contact hole CNT15. The fifteenth connection electrode CE15 may be connected to a drain electrode DE1 of a first transistor ST1 of the first pixel SP1 through a first contact hole CNT1. The fifteenth connection electrode CE15 may be connected to a drain electrode DE1 of a first transistor ST1 of the second pixel SP2 through a sixth contact hole CNT6. The fifteenth connection electrode CE15 may be connected to a drain electrode DE1 of a first transistor ST1 of the third pixel SP3 through an eleventh contact hole CNT11. Accordingly, the first voltage line VDL may supply the driving voltage or the high potential voltage to the first to third pixels SP1, SP2, and SP3 through the fifteenth connection electrode CE15.

The horizontal voltage line HVDL may be disposed at the second metal layer MTL2. The second metal layer MTL2 may be disposed on a gate insulating layer GI covering an active layer ACTL. The horizontal voltage line HVDL may be disposed on the upper side of the n-th horizontal gate line HGLn. The horizontal voltage line HVDL may be connected to the first voltage line VDL through a twenty-sixth contact hole CNT26 to receive the driving voltage or the high potential voltage. The horizontal voltage lines HVDL may supply the driving voltage or the high potential voltage to an alignment electrode ALE of a fourth metal layer MTL4.

The initialization voltage line VIL may be disposed at the first metal layer MTL1. The initialization voltage line VIL may be disposed on the right side of the auxiliary gate line BGL. A third connection electrode CE3 of the second metal layer MTL2 may electrically connect the initialization voltage line VIL to a source electrode SE3 of a third transistor ST3 of the first pixel SP1 through a fifth contact hole CNT5. An eighth connection electrode CE8 of the second metal layer MTL2 may electrically connect the initialization voltage line VIL to a source electrode SE3 of a third transistor ST3 of the second pixel SP2 through a tenth contact hole CNT10. The eighth connection electrode CE8 may electrically connect the initialization voltage line VIL to a source electrode SE3 of a third transistor ST3 of the third pixel SP3 through the tenth contact hole CNT10. The source electrode SE3 of the third transistor ST3 of the second pixel SP2 and the source electrode SE3 of the third transistor ST3 of the third pixel SP3 may be integral with each other, but are not limited thereto. Accordingly, the initialization voltage line VIL may supply an initialization voltage to the third transistor ST3 of each of the first to third pixels SP1, SP2, and SP3 and receive a sensed signal from the third transistor ST3 of each of the first to third pixels SP1, SP2, and SP3.

The vertical gate lines VGL may be disposed at the first metal layer MTL1. The n−1-th and n-th vertical gate lines VGLn−1 and VGLn may be disposed on the left side of the first voltage line VDL. The n−1-th vertical gate line VGLn−1 may overlap an auxiliary electrode AUE of the second metal layer MTL2 in the thickness direction (Z-axis direction), and may be connected to the auxiliary electrode AUE through multiple twenty-eighth contact holes CNT28. Accordingly, the n−1-th vertical gate line VGLn−1 may be connected to the auxiliary electrode AUE to decrease line resistance.

The n-th vertical gate line VGLn may be connected to the n-th horizontal gate line HGLn of the second metal layer MTL2 through a contact part MDC. The n-th vertical gate line VGLn may supply the gate signal to the n-th horizontal gate line HGLn. The n-th vertical gate line VGLn may overlap an auxiliary electrode AUE of the second metal layer MTL2 in the thickness direction (Z-axis direction), and may be connected to the auxiliary electrode AUE through multiple twenty-ninth contact holes CNT29. Accordingly, the n-th vertical gate line VGLn may be connected to the auxiliary electrode AUE to decrease line resistance.

The n-th horizontal gate line HGLn may be disposed at the second metal layer MTL2. The n-th horizontal gate line HGLn may be disposed on the upper side of the pixel circuit of the first pixel SP1. The n-th horizontal gate line HGLn may be connected to the n-th vertical gate line VGLn disposed at the first metal layer MTL1 through the contact part MDC. The n-th horizontal gate line HGLn may supply the gate signal received from the n-th vertical gate line VGLn to the auxiliary gate line BGL.

The auxiliary gate line BGL may be disposed at the second metal layer MTL2. The auxiliary gate line BGL may extend in the direction opposite to the second direction (Y-axis direction) from the n-th horizontal gate line HGLn. The auxiliary gate line BGL may be formed integrally with the n-th horizontal gate line HGLn, but is not limited thereto. The auxiliary gate line BGL may be disposed on the right side of the pixel circuits of the first to third pixels SP1, SP2, and SP3. The auxiliary gate line BGL may supply the gate signal received from the n-th horizontal gate line HGLn to the second and third transistors ST2 and ST3 of each of the first to third pixels SP1, SP2, and SP3.

The first data line DL1 may be disposed at the first metal layer MTL1. The first data line DL1 may be disposed on the right side of the initialization voltage line VIL. A second connection electrode CE2 of the second metal layer MTL2 may electrically connect the first data line DL1 to a drain electrode DE2 of a second transistor ST2 of the first pixel SP1 through a fourth contact hole CNT4. The first data line DL1 may supply the data voltage to the second transistor ST2 of the first pixel SP1.

The second data line DL2 may be disposed at the first metal layer MTL1. The second data line DL2 may be disposed on the right side of the first data line DL1. A seventh connection electrode CE7 of the second metal layer MTL2 may electrically connect the second data line DL2 to a drain electrode DE2 of a second transistor ST2 of the second pixel SP2 through a ninth contact hole CNT9. The second data line DL2 may supply the data voltage to the second transistor ST2 of the second pixel SP2.

The third data line DL3 may be disposed at the first metal layer MTL1. The third data line DL3 may be disposed on the right side of the second data line DL2. A twelfth connection electrode CE12 of the second metal layer MTL2 may electrically connect the third data line DL3 to a drain electrode DE2 of a second transistor ST2 of the third pixel SP3 through a fourteenth contact hole CNT14. The third data line DL3 may supply the data voltage to the second transistor ST2 of the third pixel SP3.

The vertical voltage line VVSL may be disposed at the first metal layer MTL1. The vertical voltage line VVSL may be disposed on the right side of the third data line DL3. The vertical voltage line VVSL may be connected to the second voltage line VSL of the second metal layer MTL2 through a twenty-seventh contact hole CNT27. The vertical voltage line VVSL may supply the low potential voltage to the second voltage line VSL. The vertical voltage line VVSL may overlap an auxiliary electrode AUE of the second metal layer MTL2 in the thickness direction (Z-axis direction), and may be connected to the auxiliary electrode AUE through multiple thirtieth contact holes CNT30. Accordingly, the vertical voltage line VVSL may be connected to the auxiliary electrode AUE to decrease line resistance.

The second voltage line VSL may be disposed at the second metal layer MTL2. The second voltage lines VSL may be disposed on the lower side of the pixel circuit of the second pixel SP2. The second voltage line VSL may supply the low potential voltage received from the vertical voltage line VVSL to a second electrode (RME2 in FIG. 12) of each of the first to third pixels SP1, SP2, and SP3. For example, the second voltage line VSL may be connected to the second electrode of the first pixel SP1 through a twenty-third contact hole CNT23. The second voltage line VSL may be connected to the second electrode of the second pixel SP2 through a twenty-fourth contact hole CNT24. The second voltage line VSL may be connected to the second electrode of the third pixel SP3 through a twenty-fifth contact hole CNT25. The second electrode of each of the first to third pixels SP1, SP2, and SP3 may be disposed at a fourth metal layer, and the twenty-third to twenty-fifth contact holes CNT23, CNT24, and CNT25 may be formed to penetrate through a via layer VIA and a passivation layer PV. The passivation layer PV may be disposed on the second metal layer MTL2 and the gate insulating layer GI, and the via layer VIA may be disposed on the passivation layer PV.

The pixel circuit of the first pixel SP1 may include the first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed at the second metal layer MTL2. The gate electrode GE1 of the first transistor ST1 may be formed integrally with a first connection electrode CE1. The first connection electrode CE1 may be connected to a first capacitor electrode CPE1 of a first capacitor C1 disposed at the active layer ACTL through a third contact hole CNT3. The first capacitor electrode CPE1 of the first capacitor C1 may become a conductor by heat-treating the active layer ACTL. The first capacitor electrode CPE1 of the first capacitor C1 may be formed integrally with a source electrode SE2 of the second transistor ST2, but is not limited thereto.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The fifteenth connection electrode CE15 may be connected to the drain electrode DE1 of the first transistor ST1 of the first pixel SP1 through the first contact hole CNT1. The fifteenth connection electrode CE15 may electrically connect the first voltage line VDL to the drain electrode DE1 of the first transistor ST1. The drain electrode DE1 of the first transistor ST1 may receive the driving voltage or the high potential voltage from the first voltage line VDL.

A fourth connection electrode CE4 of the second metal layer MTL2 may electrically connect the source electrode SE1 of the first transistor ST1, a drain electrode DE3 of the third transistor ST3, and a second capacitor electrode CPE2 of the first metal layer MTL1 to each other through a second contact hole CNT2. The first capacitor C1 may be formed between the first capacitor electrode CPE1 of the active layer ACTL and the second capacitor electrode CPE2 of the first metal layer MTL1.

A fifth connection electrode CE5 of the second metal layer MTL2 may be connected to the second capacitor electrode CPE2 through a sixteenth contact hole CNT16. The fifth connection electrode CE5 may be connected to a first electrode (RME1 in FIG. 12) of the first pixel SP1 through a seventeenth contact hole CNT17. The first electrode of the first pixel SP1 may be disposed at the fourth electrode layer, and the seventeenth contact hole CNT17 may be formed to penetrate through the via layer VIA and the passivation layer PV.

The second transistor ST2 of the first pixel SP1 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the first data line DL1 through the second connection electrode CE2. The drain electrode DE2 of the second transistor ST2 may receive the data voltage of the first pixel SP1 from the first data line DL1.

The source electrode SE2 of the second transistor ST2 may be formed integrally with the first capacitor electrode CPE1 of the first capacitor C1. The source electrode SE2 of the second transistor ST2 may be electrically connected to the gate electrode GE1 of the first transistor ST1 through the first capacitor electrode CPE1 and the first connection electrode CE1.

The third transistor ST3 of the first pixel SP1 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be electrically connected to the source electrode SE1 of the first transistor ST1 and the second capacitor electrode CPE2 through the fourth connection electrode CE4.

The source electrode SE3 of the third transistor ST3 may be connected to the third connection electrode CE3 of the second metal layer MTL2 through the fifth contact hole CNT5. The third connection electrode CE3 may electrically connect the source electrode SE3 of the third transistor ST3 to the initialization voltage line VIL. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the second pixel SP2 may include the first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer MTL2. The gate electrode GE1 of the first transistor ST1 may be formed integrally with a sixth connection electrode CE6. The sixth connection electrode CE6 may be connected to a first capacitor electrode CPE1 of a first capacitor C1 disposed at the active layer ACTL through an eighth contact hole CNT8. The first capacitor electrode CPE1 of the first capacitor C1 may become a conductor by heat-treating the active layer ACTL. The first capacitor electrode CPE1 of the first capacitor C1 may be formed integrally with a source electrode SE2 of the second transistor ST2, but is not limited thereto.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The fifteenth connection electrode CE15 may be connected to the drain electrode DE1 of the first transistor ST1 of the second pixel SP2 through the sixth contact hole CNT6. The fifteenth connection electrode CE15 may electrically connect the first voltage line VDL to the drain electrode DE1 of the first transistor ST1. The drain electrode DE1 of the first transistor ST1 may receive the driving voltage or the high potential voltage from the first voltage line VDL.

A ninth connection electrode CE9 of the second metal layer MTL2 may electrically connect the source electrode SE1 of the first transistor ST1, a drain electrode DE3 of the third transistor ST3, and a second capacitor electrode CPE2 of the first metal layer MTL1 to each other through a seventh contact hole CNT7. The first capacitor C1 may be formed between the first capacitor electrode CPE1 of the active layer ACTL and the second capacitor electrode CPE2 of the first metal layer MTL1.

A tenth connection electrode CE10 of the second metal layer MTL2 may be connected to the second capacitor electrode CPE2 through an eighteenth contact hole CNT18. The tenth connection electrode CE10 may be connected to a first electrode (RME1 in FIG. 12) of the second pixel SP2 through a nineteenth contact hole CNT19. The first electrode of the second pixel SP2 may be disposed at the fourth electrode layer, and the nineteenth contact hole CNT19 may be formed to penetrate through the via layer VIA and the passivation layer PV.

The second transistor ST2 of the second pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the second data line DL2 through the seventh connection electrode CE7. The drain electrode DE2 of the second transistor ST2 may receive the data voltage of the second pixel SP2 from the second data line DL2.

The source electrode SE2 of the second transistor ST2 may be formed integrally with the first capacitor electrode CPE1 of the first capacitor C1. The source electrode SE2 of the second transistor ST2 may be electrically connected to the gate electrode GE1 of the first transistor ST1 through the first capacitor electrode CPE1 and the sixth connection electrode CE6.

The third transistor ST3 of the second pixel SP2 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be connected to the source electrode SE1 of the first transistor ST1 and the second capacitor electrode CPE2 through the ninth connection electrode CE9.

The source electrode SE3 of the third transistor ST3 may be connected to the eighth connection electrode CE8 of the second metal layer MTL2 through the tenth contact hole CNT10. The eighth connection electrode CE8 may electrically connect the source electrode SE3 of the third transistor ST3 to the initialization voltage line VIL. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the third pixel SP3 may include the first to third transistors ST1, ST2, and ST3. The first transistor ST1 of the third pixel SP3 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer MTL2. The gate electrode GE1 of the first transistor ST1 may be formed integrally with an eleventh connection electrode CE11. The eleventh connection electrode CE11 may be connected to a first capacitor electrode CPE1 of a first capacitor C1 disposed at the active layer ACTL through a thirteenth contact hole CNT13. The first capacitor electrode CPE1 of the first capacitor C1 may become a conductor by heat-treating the active layer ACTL. The first capacitor electrode CPE1 of the first capacitor C1 may be formed integrally with a source electrode SE2 of the second transistor ST2, but is not limited thereto.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The fifteenth connection electrode CE15 may be connected to the drain electrode DE1 of the first transistor ST1 of the third pixel SP3 through the eleventh contact hole CNT11. The fifteenth connection electrode CE15 may electrically connect the first voltage line VDL to the drain electrode DE1 of the first transistor ST1. The drain electrode DE1 of the first transistor ST1 may receive the driving voltage or the high potential voltage from the first voltage line VDL.

A thirteenth connection electrode CE13 of the second metal layer MTL2 may electrically connect the source electrode SE1 of the first transistor ST1, a drain electrode DE3 of the third transistor ST3, and a second capacitor electrode CPE2 of the first metal layer MTL1 to each other through a twelfth contact hole CNT12. The first capacitor C1 may be formed between the first capacitor electrode CPE1 of the active layer ACTL and the second capacitor electrode CPE2 of the first metal layer MTL1.

A fourteenth connection electrode CE14 of the second metal layer MTL2 may be connected to the second capacitor electrode CPE2 through a twentieth contact hole CNT20. The fourteenth connection electrode CE14 may be connected to a first electrode (RME1 in FIG. 12) of the third pixel SP3 through a twenty-first contact hole CNT21. The first electrode of the third pixel SP3 may be disposed at the fourth electrode layer, and the twenty-first contact hole CNT21 may be formed to penetrate through the via layer VIA and the passivation layer PV.

The second transistor ST2 of the third pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the third data line DL3 through the twelfth connection electrode CE12. The drain electrode DE2 of the second transistor ST2 may receive the data voltage of the third pixel SP3 from the third data line DL3.

The source electrode SE2 of the second transistor ST2 may be formed integrally with the first capacitor electrode CPE1 of the first capacitor C1. The source electrode SE2 of the second transistor ST2 may be electrically connected to the gate electrode GE1 of the first transistor ST1 through the first capacitor electrode CPE1 and the eleventh connection electrode CE11.

The third transistor ST3 of the third pixel SP3 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be connected to the source electrode SE1 of the first transistor ST1 and the second capacitor electrode CPE2 through the thirteenth connection electrode CE13.

The source electrode SE3 of the third transistor ST3 may be connected to the eighth connection electrode CE8 of the second metal layer MTL2 through the tenth contact hole CNT10. The eighth connection electrode CE8 may electrically connect the source electrode SE3 of the third transistor ST3 to the initialization voltage line VIL. The source electrode SE3 of the third transistor ST3 may receive the initialization voltage from the initialization voltage line VIL. The source electrode SE3 of the third transistor ST3 may supply the sensed signal to the initialization voltage line VIL.

Figure 8:
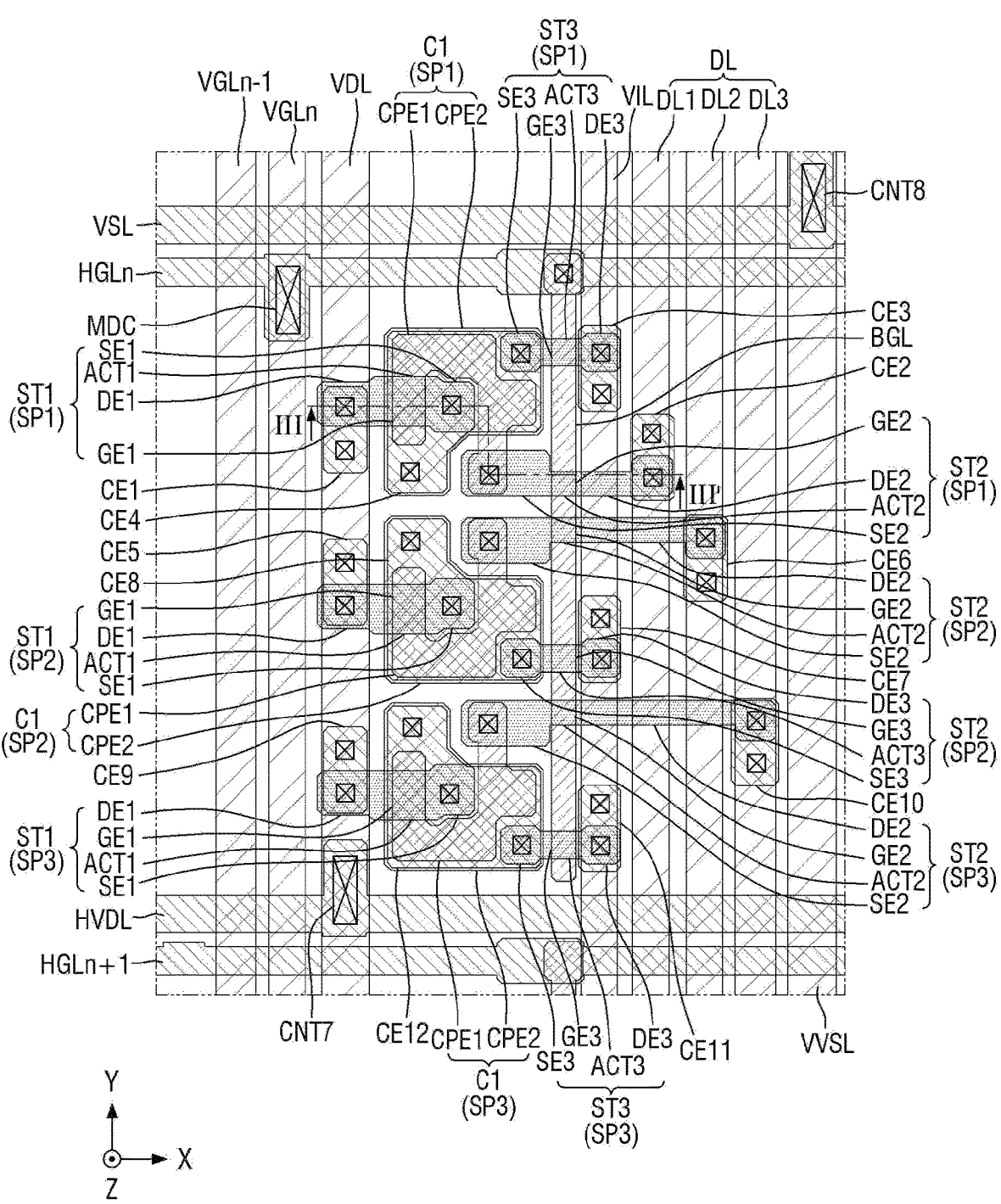
FIG. 8 is a plan view illustrating a thin film transistor layer of a display device according to another embodiment.
Figure 9:
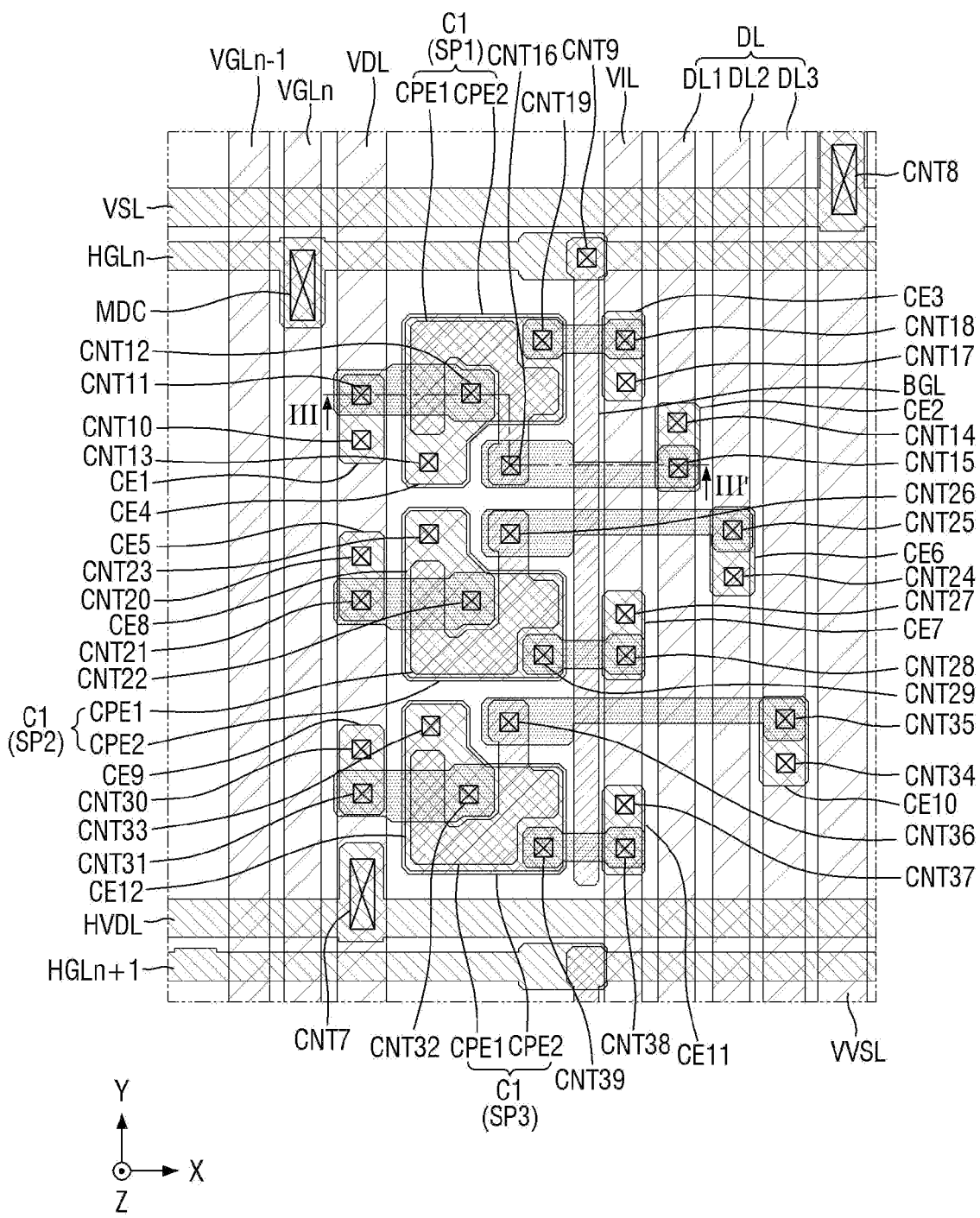
FIG. 9 is a plan view illustrating a thin film transistor layer of a display device according to another embodiment.
Figure 10:
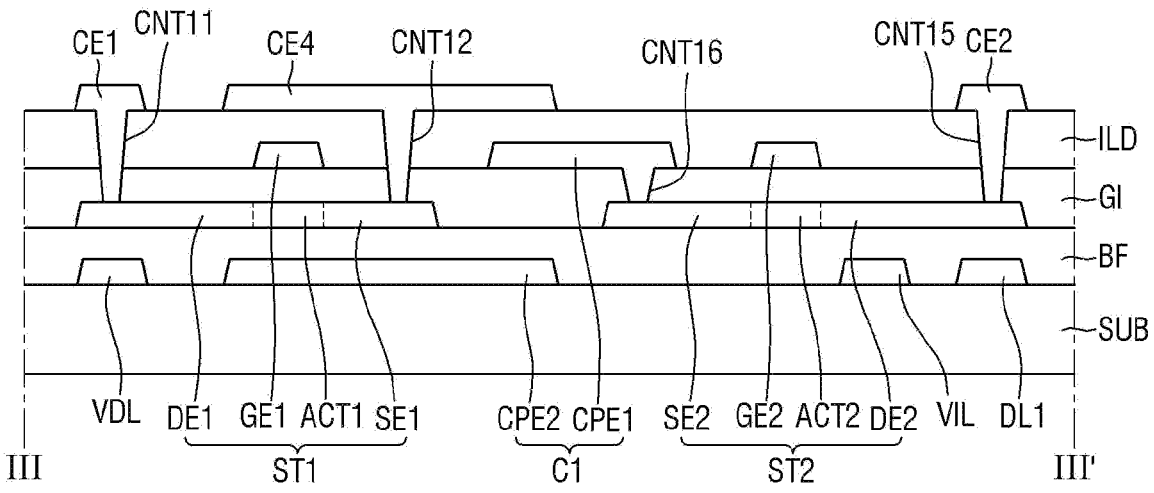
FIG. 10 is a schematic cross-sectional view taken along line III-III' of FIGS. 8 and 9.

FIGS. 8 and 9 are plan views illustrating a thin film transistor layer of a display device according to another embodiment, and FIG. 10 is a schematic cross-sectional view taken along line III-III' of FIGS. 8 and 9.

Referring to FIGS. 8 to 10, the display area DA may include a pixel SP, a first voltage line VDL, a horizontal voltage line HVDL, an n−1-th vertical gate line VGLn−1, an n-th vertical gate line VGLn, an n-th horizontal gate line HGLn, an n+1-th horizontal gate line HGLn+1, an auxiliary gate line BGL, an initialization voltage line VIL, a data line DL, a vertical voltage line VVSL, and a second voltage line VSL.

The pixel SP may include first to third pixels SP1, SP2, and SP3. A pixel circuit of the first pixel SP1, a pixel circuit of the second pixel SP2, and a pixel circuit of the third pixel SP3 may be arranged in the direction opposite to the second direction (Y-axis direction).

The first voltage line VDL may be disposed at a first metal layer MTL1 on a substrate SUB. The first voltage line VDL may be disposed on the left side of the pixel circuits of the first to third pixels SP1, SP2, and SP3. The first voltage line VDL may be connected to a first connection electrode CE1 of a third metal layer MTL3 through a tenth contact hole CNT10, and the first connection electrode CE1 may be connected to a drain electrode DE1 of a first transistor ST1 of the first pixel SP1 through an eleventh contact hole CNT11. The first voltage line VDL may be connected to a fifth connection electrode CE5 of the third metal layer MTL3 through a twentieth contact hole CNT20, and the fifth connection electrode CE5 may be connected to a drain electrode DE1 of a first transistor ST1 of the second pixel SP2 through a twenty-first contact hole CNT21. The first voltage line VDL may be connected to a ninth connection electrode CE9 of the third metal layer MTL3 through a thirtieth contact hole CNT30, and the ninth connection electrode CE9 may be connected to a drain electrode DE1 of a first transistor ST1 of the third pixel SP3 through a thirty-first contact hole CNT31.

The horizontal voltage line HVDL may be disposed at the third metal layer MTL3. The third metal layer MTL3 may be disposed on an interlayer insulating layer ILD covering a second metal layer MTL2. The horizontal voltage line HVDL may be disposed on the upper side of the n+1-th horizontal gate line HGLn+1. The horizontal voltage line HVDL may be connected to multiple first voltage lines VDL through a seventh contact hole CNT7 to receive the driving voltage. The horizontal voltage line HVDL may stably maintain the driving voltage or the high potential voltage from the first voltage lines VDL.

The vertical gate line VGL may be disposed at the first metal layer MTL1. The vertical gate line VGL may include the n−1-th vertical gate line VGLn−1 and the n-th vertical gate line VGLn disposed on the left side of the first voltage line VDL. The n−1-th vertical gate line VGLn−1 may be insulated from the n-th horizontal gate line HGLn and the n+1-th horizontal gate line HGLn+1. The n-th vertical gate line VGLn may be connected to the n-th horizontal gate line HGLn through a contact part MDC, and may be insulated from the n+1-th horizontal gate line HGLn+1.

The horizontal gate line HGL may be disposed at the third metal layer MTL3. The n-th horizontal gate line HGLn may be disposed on the upper side of the pixel circuit of the first pixel SP1. The n-th horizontal gate line HGLn may be connected to the n-th vertical gate line VGLn through the contact part MDC. The n-th horizontal gate line HGLn may be connected to the auxiliary gate line BGL through a ninth first contact hole CNT9. The n-th horizontal gate line HGLn may supply the gate signal received from the n-th vertical gate line VGLn to the auxiliary gate line BGL. The n+1-th horizontal gate line HGLn+1 may be disposed on the lower side of the horizontal voltage line HVDL.

The auxiliary gate line BGL may be disposed at the second metal layer MTL2. The second metal layer MTL2 may be disposed on a gate insulating layer GI covering an active layer ACTL. The auxiliary gate line BGL may extend in the direction opposite to the second direction (Y-axis direction) from the n-th horizontal gate line HGLn. The auxiliary gate line BGL may be disposed on the right side of the pixel circuits of the first to third pixels SP1, SP2, and SP3. The auxiliary gate lines BGL may supply the gate signals received from the horizontal gate lines HGL to the first to third pixels SP1, SP2, and SP3.

The initialization voltage line VIL may be disposed at the first metal layer MTL1. The initialization voltage line VIL may be disposed on the right side of the auxiliary gate line BGL. The initialization voltage line VIL may be connected to a third connection electrode CE3 of the third metal layer MTL3 through a seventeenth contact hole CNT17, and the third connection electrode CE3 may be connected to a drain electrode DE3 of a third transistor ST3 of the first pixel SP1 through an eighteenth contact hole CNT18. The initialization voltage line VIL may be connected to a seventh connection electrode CE7 of the third metal layer MTL3 through a twenty-seventh contact hole CNT27, and the seventh connection electrode CE7 may be connected to a drain electrode DE3 of a third transistor ST3 of the second pixel SP2 through a twenty-eighth contact hole CNT28. The initialization voltage line VIL may be connected to an eleventh connection electrode CE11 of the third metal layer MTL3 through a thirty-seventh contact hole CNT37, and the eleventh connection electrode CE11 may be connected to a drain electrode DE3 of a third transistor ST3 of the third pixel SP3 through a thirty-eighth contact hole CNT38. Accordingly, the initialization voltage line VIL may supply the initialization voltage to the third transistor ST3 of each of the first to third pixels SP1, SP2, and SP3 and receive the sensed signal from the third transistor ST3 of each of the first to third pixels SP1, SP2, and SP3.

The first data line DL1 may be disposed at the first metal layer MTL1. The first data line DL1 may be disposed on the right side of the initialization voltage line VIL. The first data line DL1 may be connected to a second connection electrode CE2 of the third metal layer MTL3 through a fourteenth contact hole CNT14, and the second connection electrode CE2 may be connected to a drain electrode DE2 of a second transistor ST2 of the first pixel SP1 through a fifteenth contact hole CNT15. The first data line DL1 may supply the data voltage to the second transistor ST2 of the first pixel SP1.

The second data line DL2 may be disposed at the first metal layer MTL1. The second data line DL2 may be disposed on the right side of the first data line DL1. The second data line DL2 may be connected to a sixth connection electrode CE6 of the third metal layer MTL3 through a twenty-fourth contact hole CNT24, and the sixth connection electrode CE6 may be connected to a drain electrode DE2 of a second transistor ST2 of the second pixel SP2 through a twenty-fifth contact hole CNT25. The second data line DL2 may supply the data voltage to the second transistor ST2 of the second pixel SP2.

The third data line DL3 may be disposed at the first metal layer MTL1. The third data line DL3 may be disposed on the right side of the second data line DL2. The third data line DL3 may be connected to a tenth connection electrode CE10 of the third metal layer MTL3 through a thirty-fourth contact hole CNT34, and the tenth connection electrode CE10 may be connected to a drain electrode DE2 of a second transistor ST2 of the third pixel SP3 through a thirty-fifth contact hole CNT35. The third data line DL3 may supply the data voltage to the second transistor ST2 of the third pixel SP3.

The vertical voltage line VVSL may be disposed at the first metal layer MTL1. The vertical voltage line VVSL may be disposed on the right side of the third data line DL3. The vertical voltage line VVSL may be connected to the second voltage line VSL of the third metal layer MTL3 through an eighth contact hole CNT8. The vertical voltage line VVSL may supply the low potential voltage to the second voltage line VSL.

The second voltage line VSL may be disposed at the third metal layer MTL3. The second voltage line VSL may be disposed on the upper side of the n-th horizontal gate line HGLn. The second voltage line VSL may supply the low potential voltage received from the vertical voltage line VVSL to a second electrode (RME2 in FIG. 12) of each of the first to third pixels SP1, SP2, and SP3. The second electrode of each of the first to third pixels SP1, SP2, and SP3 may be disposed at a fourth metal layer MTL4 on the third metal layer MTL3.

The pixel circuit of the first pixel SP1 may include the first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be connected to a source electrode SE2 of the second transistor ST2 of the active layer ACTL through a sixteenth contact hole CNT16.

The drain electrode DE1 and the source electrode SE1 of the first transistor ST1 may become conductors by heat-treating the active layer ACTL. The drain electrode DE1 of the first transistor ST1 may be connected to the first voltage line VDL through the first connection electrode CE1. The drain electrode DE1 of the first transistor ST1 may receive the driving voltage from the first voltage line VDL.

The source electrode SE1 of the first transistor ST1 may be connected to a fourth connection electrode CE4 of the third metal layer MTL3 through a twelfth contact hole CNT12. The fourth connection electrode CE4 may be connected to a second capacitor electrode CPE2 of the first metal layer MTL1 through a thirteenth contact hole CNT13. Accordingly, the first capacitor C1 may be formed doubly between the first capacitor electrode CPE1 and the second capacitor electrode CPE2 and between the first capacitor electrode CPE1 and the fourth connection electrode CE4.

The fourth connection electrode CE4 may be connected to a source electrode SE3 of the third transistor ST3 through a nineteenth contact hole CNT19. The fourth connection electrode CE4 may be connected to a first electrode (RME1 in FIG. 12) of the first pixel SP1. The first electrode of the first pixel SP1 may be disposed at the fourth metal layer MTL4.

The second transistor ST2 of the first pixel SP1 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be connected to the first data line DL1 through the second connection electrode CE2. The drain electrode DE2 of the second transistor ST2 may receive the data voltage of the first pixel SP1 from the first data line DL1.

The source electrode SE2 of the second transistor ST2 may be connected to the first capacitor electrode CPE1 through the sixteenth contact hole CNT16 to be connected to the gate electrode GE1 of the first transistor ST1.

The third transistor ST3 of the first pixel SP1 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be connected to the initialization voltage line VIL through the third connection electrode CE3. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the fourth connection electrode CE4 through the nineteenth contact hole CNT19. The fourth connection electrode CE4 may be connected to the source electrode SE1 of the first transistor ST1 through the twelfth contact hole CNT12, and may be connected to the second capacitor electrode CPE2 of the first metal layer MTL1 through the thirteenth contact hole CNT13.

The pixel circuit of the second pixel SP2 may include the first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be connected to a source electrode SE2 of the second transistor ST2 of the active layer ACTL through a twenty-sixth contact hole CNT26.

The drain electrode DE1 and the source electrode SE1 of the first transistor ST1 may become conductors by heat-treating the active layer. The drain electrode DE1 of the first transistor ST1 may be connected to the first voltage line VDL through the fifth connection electrode CE5. The drain electrode DE1 of the first transistor ST1 may receive the driving voltage from the first voltage line VDL.

The source electrode SE1 of the first transistor ST1 may be connected to an eighth connection electrode CE8 of the third metal layer MTL3 through a twenty-second contact hole CNT22. The eighth connection electrode CE8 may be connected to a second capacitor electrode CPE2 of the first metal layer MTL1 through a twenty-third contact hole CNT23. Accordingly, the first capacitor C1 may be formed doubly between the first capacitor electrode CPE1 and the second capacitor electrode CPE2 and between the first capacitor electrode CPE1 and the eighth connection electrode CE8.

The eighth connection electrode CE8 may be connected to a source electrode SE3 of the third transistor ST3 through a twenty-ninth contact hole CNT29. The eighth connection electrode CE8 may be connected to a first electrode (RME1 in FIG. 12) of the second pixel SP2. The first electrode of the second pixel SP2 may be disposed at the fourth metal layer MTL4.

The second transistor ST2 of the second pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be connected to the second data line DL2 through the sixth connection electrode CE6. The drain electrode DE2 of the second transistor ST2 may receive the data voltage of the second pixel SP2 from the second data line DL2.

The source electrode SE2 of the second transistor ST2 may be connected to the first capacitor electrode CPE1 through the twenty-sixth contact hole CNT26 to be connected to the gate electrode GE1 of the first transistor ST1.

The third transistor ST3 of the second pixel SP2 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be connected to the initialization voltage line VIL through the seventh connection electrode CE7. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the eighth connection electrode CE8 through the twenty-ninth contact hole CNT29. The eighth connection electrode CE8 may be connected to the source electrode SE1 of the first transistor ST1 through the twenty-second contact hole CNT22, and may be connected to the second capacitor electrode CPE2 of the first metal layer MTL1 through the twenty-third contact hole CNT23.

The pixel circuit of the third pixel SP3 may include the first to third transistors ST1, ST2, and ST3. The first transistor ST1 of the third pixel SP3 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be connected to a source electrode SE2 of the second transistor ST2 of the active layer ACTL through a thirty-sixth contact hole CNT36.

The drain electrode DE1 and the source electrode SE1 of the first transistor ST1 may become conductors by heat-treating the active layer. The drain electrode DE1 of the first transistor ST1 may be connected to the first voltage line VDL through the ninth connection electrode CE9. The drain electrode DE1 of the first transistor ST1 may receive the driving voltage from the first voltage line VDL.

The source electrode SE1 of the first transistor ST1 may be connected to a twelfth connection electrode CE12 of the third metal layer MTL3 through a thirty-second contact hole CNT32. The twelfth connection electrode CE12 may be connected to a second capacitor electrode CPE2 of the first metal layer MTL1 through a thirty-third contact hole CNT33. Accordingly, the first capacitor C1 may be formed doubly between the first capacitor electrode CPE1 and the second capacitor electrode CPE2 and between the first capacitor electrode CPE1 and the twelfth connection electrode CE12.

The twelfth connection electrode CE12 may be connected to a source electrode SE3 of the third transistor ST3 through a thirty-ninth contact hole CNT39. The twelfth connection electrode CE12 may be connected to a first electrode (RME1 in FIG. 12) of the third pixel SP3. The first electrode of the third pixel SP3 may be disposed at the fourth metal layer MTL4.

The second transistor ST2 of the third pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be connected to the third data line DL3 through the tenth connection electrode CE10. The drain electrode DE2 of the second transistor ST2 may receive the data voltage of the third pixel SP3 from the third data line DL3.

The source electrode SE2 of the second transistor ST2 may be connected to the first capacitor electrode CPE1 through the thirty-sixth contact hole CNT36 to be connected to the gate electrode GE1 of the first transistor ST1.

The third transistor ST3 of the third pixel SP3 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be connected to the initialization voltage line VIL through the eleventh connection electrode CE11. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the twelfth connection electrode CE12 through the thirty-ninth contact hole CNT39. The twelfth connection electrode CE12 may be connected to the source electrode SE1 of the first transistor ST1 through the thirty-second contact hole CNT32, and may be connected to the second capacitor electrode CPE2 of the first metal layer MTL1 through the thirty-third contact hole CNT33.

Figure 11:
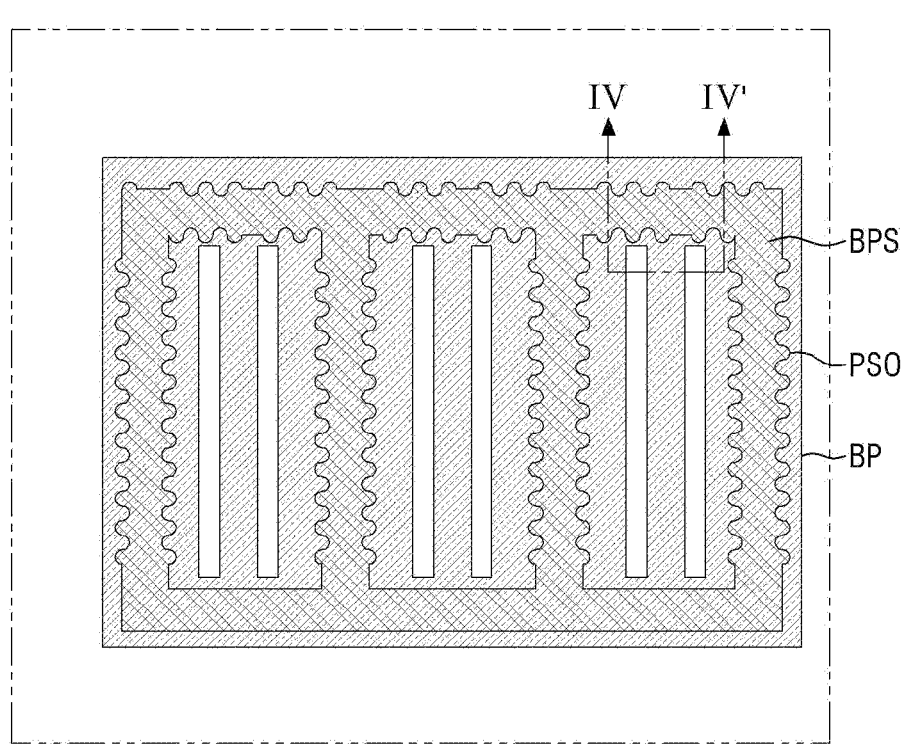
FIG. 11 is a plan view illustrating a bank pattern of the display device according to an embodiment.
Figure 11:
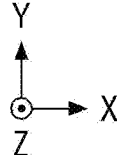
Figure 12:
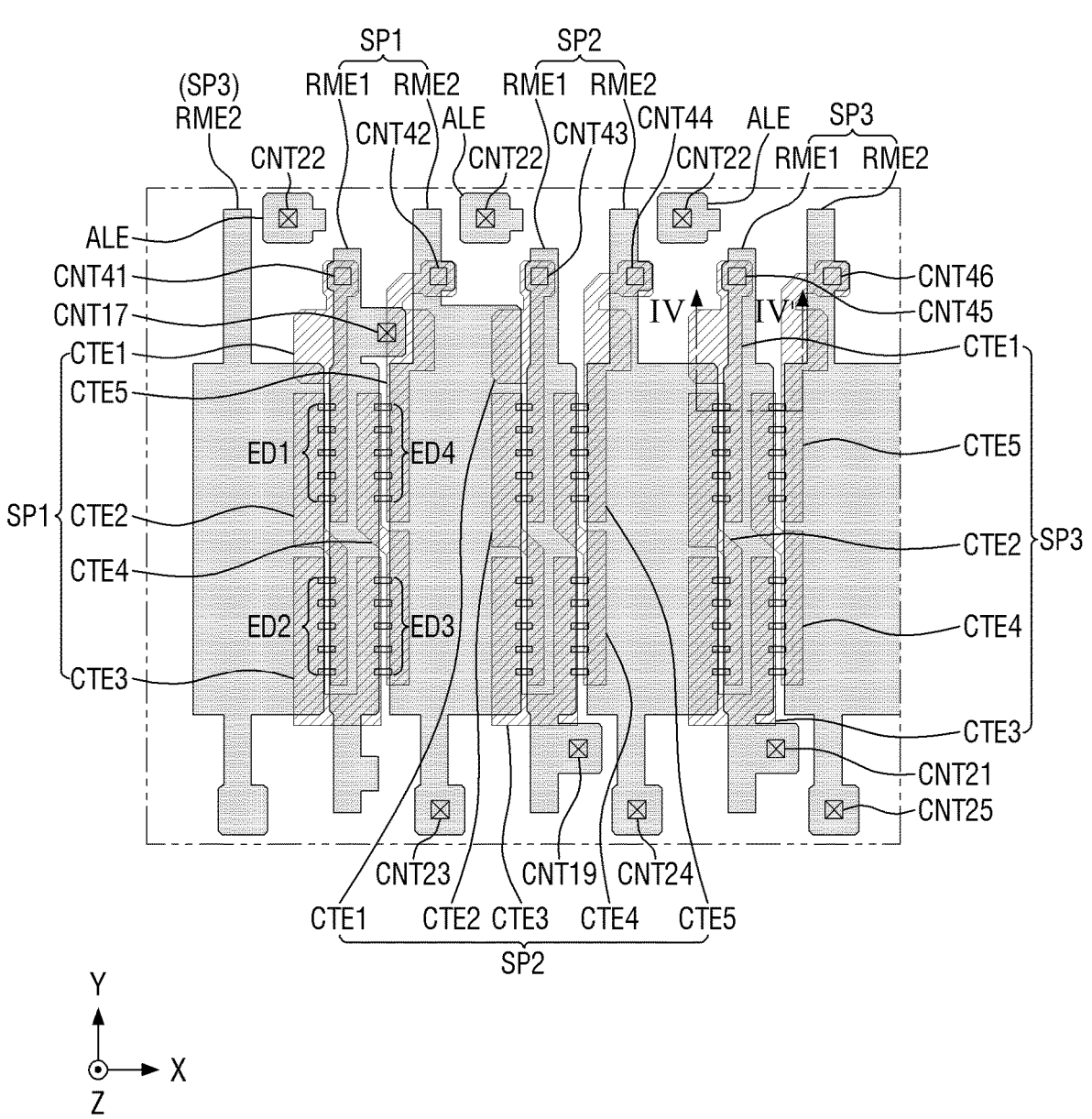
FIG. 12 is a plan view illustrating a fourth metal layer, light emitting elements, and a fifth metal layer of the display device according to an embodiment.
Figure 13:
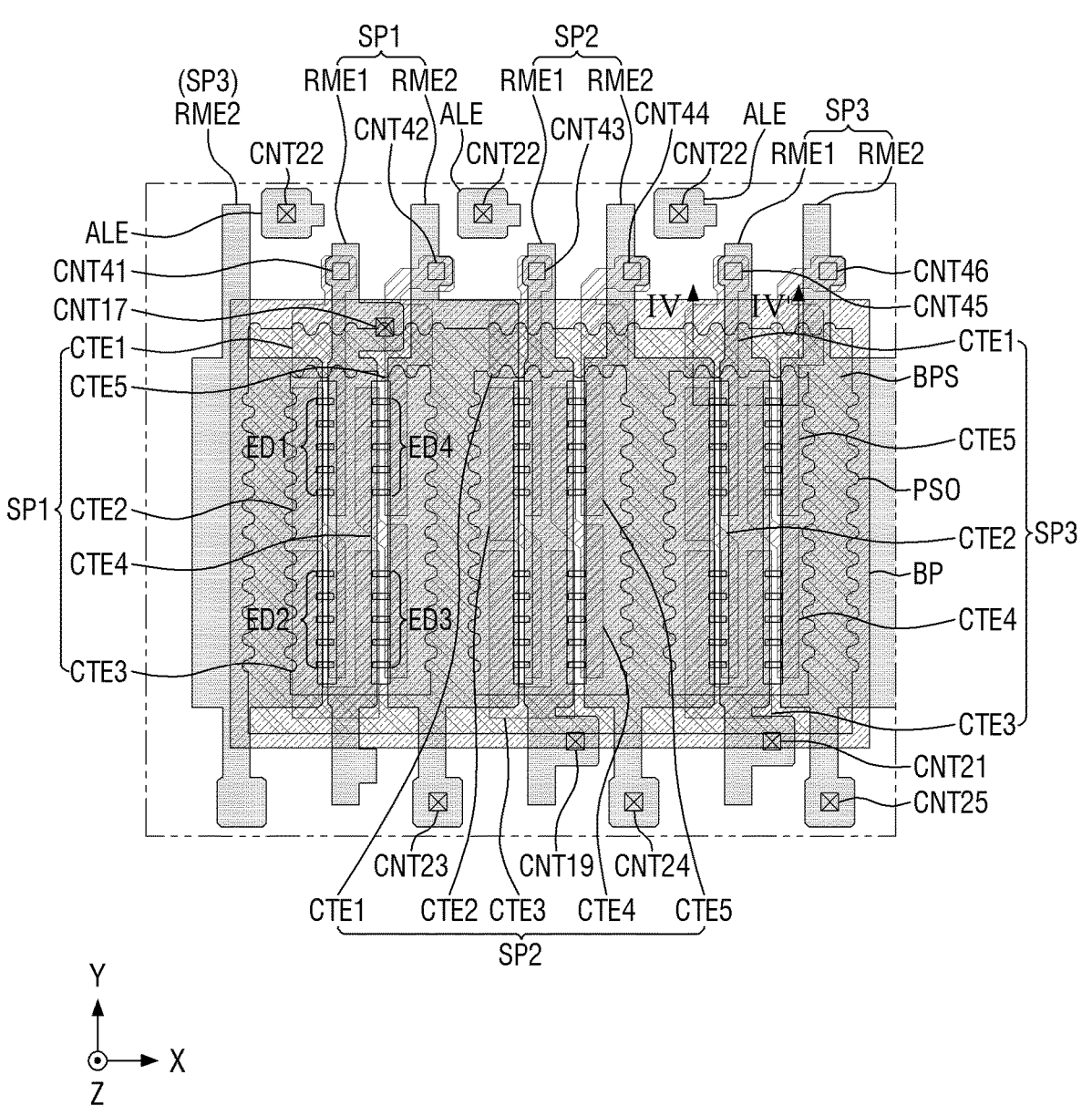
FIG. 13 is a plan view illustrating a light emitting element layer of the display device according to an embodiment.
Figure 14:
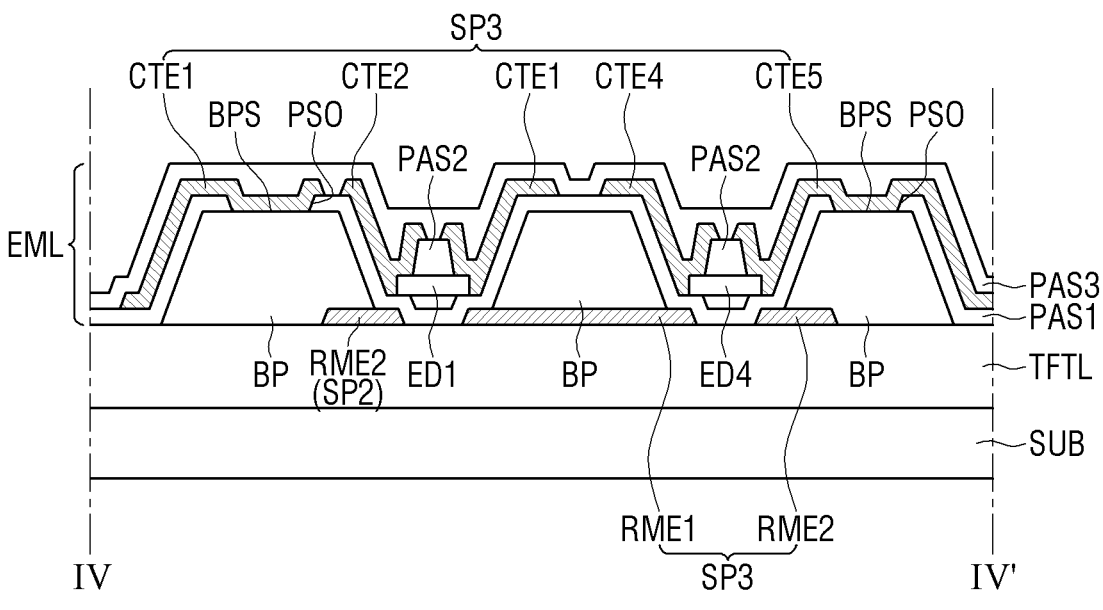
FIG. 14 is a schematic cross-sectional view taken along line IV-IV' of FIGS. 11 to 13.

FIG. 11 is a plan view illustrating a bank pattern of the display device according to an embodiment, and FIG. 12 is a plan view illustrating a fourth metal layer, light emitting elements, and a fifth metal layer of the display device according to an embodiment. FIG. 13 is a plan view illustrating a light emitting element layer of the display device according to an embodiment, and FIG. 14 is a schematic cross-sectional view taken along line IV-IV' of FIGS. 11 to 13.

Referring to FIGS. 11 to 14, a light emitting element layer EML of the display device 10 may be disposed on a thin film transistor layer TFTL. The light emitting element layer EML may include first and second electrodes RME1 and RME2, a bank pattern BP, first to fourth light emitting elements ED1, ED2, ED3 and ED4, a first insulating layer PAS1, a second insulating layer PAS2, first to fifth contact electrodes CTE1, CTE2, CTE3, CTE4, and CTE5, and a third insulating layer PAS3.

The first and electrodes RME1 and RME2 of each of the first to third pixels SP1, SP2, and SP3 may be disposed at a fourth metal layer MTL4. The fourth metal layer MTL4 may be disposed on a via layer VIA of the thin film transistor layer TFTL. The first and second electrodes RME1 and RME2 of each of the first to third pixels SP1, SP2, and SP3 may extend in the second direction (Y-axis direction). The first electrode RME1 of the first pixel SP1 may be disposed on the left side of the second electrode RME2 of the first pixel SP1. The first electrode RME1 of the second pixel SP2 may be disposed between the second electrode RME2 of the first pixel SP1 and the second electrode RME2 of the second pixel SP2. The first electrode RME1 of the third pixel SP3 may be disposed between the second electrode RME2 of the second pixel SP2 and the second electrode RME2 of the third pixel SP3.

The first electrode RME1 may be separated in units of rows. The first and second electrodes RME1 and RME2 may align the first to fourth light emitting elements ED1, ED2, ED3, and ED4 in processes of manufacturing the display device 10. The first electrode RME1 before being separated may be formed integrally with an alignment electrode ALE, and the alignment electrode ALE may be connected to the horizontal voltage line HVDL of the second metal layer MTL2 through the twenty-second contact hole CNT22. The alignment electrode ALE may receive a driving voltage or a high potential voltage from the horizontal voltage line HVDL and supply the driving voltage or the high potential voltage to the first electrode RME1. The first electrode RME1 may be separated from the alignment electrode ALE after a process of alignment of multiple light emitting elements ED is completed.

The first electrode RME1 of the first pixel SP1 may be connected to the fifth connection electrode CE5 of the second metal layer MTL2 through a seventeenth contact hole CNT17. The first electrode RME1 may receive the driving current passing through the first transistor ST1. The first electrode RME1 may supply the driving current to multiple first light emitting elements ED1 of the first pixel SP1 through the first contact electrode CTE1.

The second electrode RME2 of the first pixel SP1 may be connected to the second voltage line VSL of the second metal layer MTL2 through the twenty-third contact hole CNT23. Accordingly, the second electrode RME2 of the first pixel SP1 may receive the low potential voltage from the second voltage line VSL. The second electrode RME2 of the first pixel SP1 may overlap the pixel circuits of the first to third pixels SP1, SP2, and SP3. The second electrode RME2 of the first pixel SP1 may minimize a fluctuation of the first capacitor electrode CPE1 due to a coupling capacitor and prevent horizontal crosstalk by covering the first capacitor electrode CPE1 of each of the first to third pixels SP1, SP2, and SP3.

The first electrode RME1 of the second pixel SP2 may be connected to the tenth connection electrode CE10 of the second metal layer MTL2 through the nineteenth contact hole CNT19. The first electrode RME1 may receive the driving current passing through the first transistor ST1. The first electrode RME1 may supply the driving current to multiple first light emitting elements ED1 of the second pixel SP2 through the first contact electrode CTE1.

The second electrode RME2 of the second pixel SP2 may be connected to the second voltage line VSL of the second metal layer MTL2 through the twenty-fourth contact hole CNT24. Accordingly, the second electrode RME2 of the second pixel SP2 may receive the low potential voltage from the second voltage line VSL.

The first electrode RME1 of the third pixel SP3 may be connected to the fourteenth connection electrode CE14 of the second metal layer MTL2 through the twenty-first contact hole CNT21. The first electrode RME1 may receive the driving current passing through the first transistor ST1. The first electrode RME1 may supply the driving current to multiple first light emitting elements ED1 of the third pixel SP3 through the first contact electrode CTE1.

The second electrode RME2 of the third pixel SP3 may be connected to the second voltage line VSL of the second metal layer MTL2 through the twenty-fifth contact hole CNT25. Accordingly, the second electrode RME2 of the third pixel SP3 may receive the low potential voltage from the second voltage line VSL.

The bank pattern BP may be disposed on the via layer VIA and the fourth metal layer MTL4. The bank pattern BP may protrude in an upward direction (Z-axis direction) and may have inclined side surfaces. The bank pattern BP may surround the light emitting elements ED of each of the first to third pixels SP1, SP2, and SP3. The bank pattern BP may include at least one separation space corresponding to each of the first to third pixels SP1, SP2, and SP3. The separation spaces may extend in the second direction (Y-axis direction) and may be spaced apart from each other in the first direction (X-axis direction). The light emitting elements ED of each of the first to third pixels SP1, SP2, and SP3 may be disposed in the separation space of the bank pattern BP. For example, the first and second light emitting elements ED1 and ED2 may be disposed in a left separation space of the bank pattern BP, and the third and fourth light emitting elements ED3 and ED4 may be disposed in a right separation space of the bank pattern BP.

The first insulating layer PAS1 may cover the bank pattern BP and the first and second electrodes RME1 and RME2. The first insulating layer PAS1 may include an open part PSO provided on an upper surface of the bank pattern BP. The open part PSO of the first insulating layer PAS1 may expose a surface treatment part BPS of the bank pattern BP. For example, the first insulating layer PAS1 and the bank pattern BP may include a hydrophilic insulating material. A water repellent treatment may be performed on the surface treatment part BPS of the bank pattern BP after the open part PSO is formed. Accordingly, the surface treatment part BPS may be modified (or formed) to have hydrophobicity through a plasma treatment process.

The open part PSO may have lines (or sides) bent plural times or curved plural times in a plan view. A shape of the open part PSO in a plan view may include multiple convex portions and/or multiple concave portions. For example, the shape of the open part PSO in a plan view may be a zigzag shape or a wave shape, and the surface treatment part BPS exposed by the open part PSO may have the same shape as the open part PSO. Accordingly, the surface treatment part BPS may have sides bent plural times or curved plural times in a plan view. The open part PSO and the surface treatment part BPS may have different widths for each position. The first and fifth contact electrodes CTE1 and CTE5 may be disposed on the first insulating layer PAS1 and the surface treatment part BPS. The surface treatment part BPS may have the lines bent plural times or curved plural times, and thus, contact areas between the surface treatment part BPS and the first and fifth contact electrodes CTE1 and CTE5 may be relatively increased as compared with a case where the surface treatment part BPS has straight sides. Accordingly, even though an undercut of the surface treatment part BPS occurs in a process of forming the open part PSO, disconnection of the first and fifth contact electrodes CTE1 and CTE5 may be prevented.

The light emitting elements ED may be aligned between the first electrode RME1 and the second electrode RME2. Before the first electrode RME1 is separated from the alignment electrode ALE, each of the first and second electrodes RME1 and RME2 may receive an alignment signal, and an electric field may be formed between the first and second electrodes RME1 and RME2. For example, the light emitting elements ED may be jetted onto the first and second electrodes RME1 and RME2 through an inkjet printing process. Ink including the light emitting elements ED may be concentrated in the separation spaces of the bank pattern BP by the surface treatment part BPS having the hydrophobicity. Accordingly, the surface treatment part BPS may prevent the ink including the light emitting elements ED from leaking to the outside of the bank pattern BP. The light emitting elements ED dispersed in the ink may be aligned by receiving a dielectrophoresis force by the electric field formed between the first and second electrodes RME1 and RME2. Accordingly, the light emitting elements ED may be aligned between the first and second electrodes RME1 and RME2. The light emitting elements ED may be insulated from the first and second electrodes RME1 and RME2 by the first insulating layer PAS1.

The first and second light emitting elements ED1 and ED2 of the first pixel SP1 may be aligned between the second electrode RME2 of the third pixel SP3 and the first electrode RME1 of the first pixel SP1. The third and fourth light emitting elements ED3 and ED4 of the first pixel SP1 may be aligned between the first electrode RME1 of the first pixel SP1 and the second electrode RME2 of the first pixel SP1. The first and second light emitting elements ED1 and ED2 of the second pixel SP2 may be aligned between the second electrode RME2 of the first pixel SP1 and the first electrode RME1 of the second pixel SP2. The third and fourth light emitting elements ED3 and ED4 of the second pixel SP2 may be aligned between the first electrode RME1 of the second pixel SP2 and the second electrode RME2 of the second pixel SP2. The first and second light emitting elements ED1 and ED2 of the third pixel SP3 may be aligned between the second electrode RME2 of the second pixel SP2 and the first electrode RME1 of the third pixel SP3. The third and fourth light emitting elements ED3 and ED4 of the third pixel SP3 may be aligned between the first electrode RME1 of the third pixel SP3 and the second electrode RME2 of the third pixel SP3.

Each of the first to third pixels SP1, SP2, and SP3 may include first to fifth contact electrodes CTE1, CTE2, CTE3, CTE4, and CTE5. The first to fifth contact electrodes CTE1, CTE2, CTE3, CTE4, and CTE5 may be disposed at a fifth metal layer MTL5. The second insulating layer PAS2 may be disposed on central portions of the light emitting elements ED. The third insulating layer PAS3 may cover the first and second insulating layer PAS1 and PAS2 and the first to fifth contact electrodes CTE1, CTE2, CTE3, CTE4, and CTE5. The second and third insulating layers PAS2 and PAS3 may insulate the first to fifth contact electrodes CTE1, CTE2, CTE3, CTE4, and CTE5 from each other.

The first contact electrode CTE1 of the first pixel SP1 may be disposed on the first electrode RME1 of the first pixel SP1, and may be connected to the first electrode RME1 through a forty-first contact hole CNT41 provided in the first insulating layer PAS1. The first contact electrode CTE1 may be connected between the first electrode RME1 and one ends of the first light emitting elements ED1. The first contact electrode CTE1 may correspond to an anode electrode of each of the first light emitting elements ED1, but is not limited thereto.

The second contact electrode CTE2 may be insulated from the first and second electrodes RME1 and RME2. A first portion of the second contact electrode CTE2 may be disposed on the second electrode RME2 of the third pixel SP3 and extend in the second direction (Y-axis direction). A second portion of the second contact electrode CTE2 may be disposed on the first electrode RME1 of the first pixel SP1 and extend in the second direction (Y-axis direction). The second portion of the second contact electrode CTE2 may extend from a lower side of the first portion.

The second contact electrode CTE2 may be connected between another ends of the first light emitting elements ED1 and one ends of the second light emitting elements ED2. The second contact electrode CTE2 may correspond to the third node N3 of FIG. 3. The second contact electrode CTE2 may correspond to a cathode electrode of each of the first light emitting elements ED1, but is not limited thereto.

The second contact electrode CTE2 may correspond to an anode electrode of each of the second light emitting elements ED2, but is not limited thereto.

The third contact electrode CTE3 may be insulated from the first and second electrodes RME1 and RME2. A first portion of the third contact electrode CTE3 may be disposed on the second electrode RME2 of the third pixel SP3 and extend in the second direction (Y-axis direction). A second portion of the third contact electrode CTE3 may be disposed on the first electrode RME1 of the first pixel SP1, and may be disposed on the right side of the first portion.

The third contact electrode CTE3 may be connected between another ends of the second light emitting elements ED2 and one ends of the third light emitting elements ED3. The third contact electrode CTE3 may correspond to the fourth node N4 of FIG. 3. The third contact electrode CTE3 may correspond to a cathode electrode of each of the second light emitting elements ED2, but is not limited thereto. The third contact electrode CTE3 may correspond to an anode electrode of each of the third light emitting elements ED3, but is not limited thereto.

The fourth contact electrode CTE4 may be insulated from the first and second electrodes RME1 and RME2. A first portion of the fourth contact electrode CTE4 may be disposed on the second electrode RME2 of the first pixel SP1 and extend in the second direction (Y-axis direction). A second portion of the fourth contact electrode CTE4 may be disposed on the first electrode RME1 of the first pixel SP1 and extend in the second direction (Y-axis direction). The second portion of the fourth contact electrode CTE4 may extend from an upper side of the first portion.

The fourth contact electrode CTE4 may be connected between another ends of the third light emitting elements ED3 and one ends of the fourth light emitting elements ED4. The fourth contact electrode CTE4 may correspond to the fifth node N5 of FIG. 4. The fourth contact electrode CTE4 may correspond to a cathode electrode of each of the third light emitting elements ED3, but is not limited thereto. The fourth contact electrode CTE4 may correspond to an anode electrode of each of the fourth light emitting elements ED4, but is not limited thereto.

The fifth contact electrode CTE5 may be disposed on the second electrode RME2 of the first pixel SP1, and may be connected to the second electrode RME2 through a forty-second contact hole CNT42 provided in the first insulating layer PAS1. The fifth contact electrode CTE5 may be connected between another ends of the fourth light emitting elements ED4 and the second electrode RME2. The fifth contact electrode CTE5 may correspond to a cathode electrode of each of the fourth light emitting elements ED4, but is not limited thereto. The fifth contact electrode CTE5 may receive the low potential voltage through the second electrode RME2.

The first contact electrode CTE1 of the second pixel SP2 may be disposed on the first electrode RME1 of the second pixel SP2, and may be connected to the first electrode RME1 through a forty-third contact hole CNT43 provided in the first insulating layer PAS1. The first contact electrode CTE1 may be connected between the first electrode RME1 and one ends of the first light emitting elements ED1. The second contact electrode CTE2 may be connected between another ends of the first light emitting elements ED1 and one ends of the second light emitting elements ED2. The third contact electrode CTE3 may be connected between another ends of the second light emitting elements ED2 and one ends of the third light emitting elements ED3. The fourth contact electrode CTE4 may be connected between another ends of the third light emitting elements ED3 and one ends of the fourth light emitting elements ED4. The fifth contact electrode CTE5 may be disposed on the second electrode RME2 of the second pixel SP2, and may be connected to the second electrode RME2 through a forty-fourth contact hole CNT44 provided in the first insulating layer PAS1. The fifth contact electrode CTE5 may be connected between another ends of the fourth light emitting elements ED4 and the second electrode RME2. The fifth contact electrode CTE5 may receive the low potential voltage through the second electrode RME2.

The first contact electrode CTE1 of the third pixel SP3 may be disposed on the first electrode RME1 of the third pixel SP3, and may be connected to the first electrode RME1 through a forty-fifth contact hole CNT45 provided in the first insulating layer PAS1. The first contact electrode CTE1 may be connected between the first electrode RME1 and one ends of the first light emitting elements ED1. The second contact electrode CTE2 may be connected between another ends of the first light emitting elements ED1 and one ends of the second light emitting elements ED2. The third contact electrode CTE3 may be connected between another ends of the second light emitting elements ED2 and one ends of the third light emitting elements ED3. The fourth contact electrode CTE4 may be connected between another ends of the third light emitting elements ED3 and one ends of the fourth light emitting elements ED4. The fifth contact electrode CTE5 may be disposed on the second electrode RME2 of the third pixel SP3, and may be connected to the second electrode RME2 through a forty-sixth contact hole CNT46 provided in the first insulating layer PAS1. The fifth contact electrode CTE5 may be connected between another ends of the fourth light emitting elements ED4 and the second electrode RME2. The fifth contact electrode CTE5 may receive the low potential voltage through the second electrode RME2.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a thin film transistor layer disposed on a substrate and including a transistor;
a first electrode and a second electrode, each disposed on the thin film transistor layer and extending in parallel with each other;
a bank pattern disposed on the first and second electrodes;
an insulating layer disposed on the bank pattern and the first and second electrodes and including an open part provided on an upper surface of the bank pattern;
a plurality of light emitting elements disposed between the first and second electrodes on the insulating layer; and
a surface treatment part on the upper surface of the bank pattern exposed by the open part and having hydrophobicity, wherein a shape of the open part has lines bent plural times or lines curved plural times in a plan view.

2. The display device of claim 1, wherein the shape of the open part is a zigzag shape or a wave shape in a plan view.

3. The display device of claim 1, wherein the shape of the open part has a plurality of convex portions or a plurality of concave portions in a plan view.

4. The display device of claim 1, further comprising:
a first contact electrode disposed on the insulating layer and the surface treatment part; and
a second contact electrode spaced apart from the first contact electrode and disposed on the insulating layer and the surface treatment part.

5. The display device of claim 4, wherein
the first contact electrode is disposed on the first electrode, and
the first contact electrode is electrically connected to the first electrode through a first contact hole provided in the insulating layer.

6. The display device of claim 5, wherein the first contact electrode supplies a driving current received from the first electrode to an end of each of the plurality of light emitting elements.

7. The display device of claim 4, wherein
the second contact electrode is disposed on the second electrode, and
the second contact electrode is electrically connected to the second electrode through a second contact hole provided in the insulating layer.

8. The display device of claim 7, wherein
the second contact electrode is electrically connected to an end of each of the plurality of light emitting elements, and
the second contact electrode receives a low potential voltage from the second electrode.

9. The display device of claim 1, wherein
the bank pattern includes at least one separation space, and
the plurality of light emitting elements are disposed in the at least one separation space.

10. The display device of claim 1, wherein
the insulating layer and the bank pattern include a hydrophilic insulating material, and
the surface treatment part is formed by a plasma treatment process to have the hydrophobicity.

11. A display device comprising:
a thin film transistor layer disposed on a substrate and including a transistor;
a first electrode and a second electrode, each disposed on the thin film transistor layer and extending in parallel with each other;
a bank pattern disposed on the first and second electrodes;
an insulating layer disposed on the bank pattern and including an open part provided on an upper surface of the bank pattern;
a plurality of light emitting elements disposed between the first and second electrodes on the insulating layer; and
a surface treatment part on the upper surface of the bank pattern exposed by the open part and having hydrophobicity,
wherein a shape of the surface treatment part is a zigzag shape or a wave shape in a plan view.

12. The display device of claim 11, wherein the shape of the surface treatment part has lines bent plural times or lines curved plural times in a plan view.

13. The display device of claim 11, wherein the shape of the surface treatment part has a plurality of convex portions or a plurality of concave portions in a plan view.

14. The display device of claim 11, further comprising:

a first contact electrode, a second contact electrode, a third contact electrode, a fourth contact electrode, and a fifth contact electrode, each disposed on the insulating layer or the surface treatment part.

15. The display device of claim 14, wherein the plurality of light emitting elements include:

first light emitting elements electrically connected between the first and second contact electrodes;

second light emitting elements electrically connected between the second and third contact electrodes;

third light emitting elements electrically connected between the third and fourth contact electrodes; and fourth light emitting elements electrically connected between the fourth and fifth contact electrodes.

16. The display device of claim 15, wherein the first and second light emitting elements are arranged to be collinear with each other, and the third and fourth light emitting elements are arranged to be collinear with each other.

17. The display device of claim 15, wherein the bank pattern surrounds the first to fourth light emitting elements and includes at least one separation space, and the first to fourth light emitting elements are disposed in the at least one separation space of the bank pattern.

18. The display device of claim 15, wherein the first contact electrode is electrically connected to the first electrode to receive a driving current from the first electrode, and the fifth contact electrode is electrically connected to the second electrode to receive a low potential voltage from the second electrode.

19. The display device of claim 11, wherein the insulating layer and the bank pattern include a hydrophilic insulating material, and the surface treatment part is formed by a plasma treatment process to have the hydrophobicity.

20. The display device of claim 11, wherein the thin film transistor layer includes:

a first transistor supplying a driving current to the plurality of light emitting elements;

a second transistor supplying a data voltage to a first node that is electrically connected to a gate electrode of the first transistor;

a third transistor supplying an initialization voltage to a second node that is electrically connected to a source electrode of the first transistor; and a first capacitor electrically connected between the first node and the second node.

* * * * *